(12) United States Patent
Kim et al.

(10) Patent No.: US 10,494,549 B2
(45) Date of Patent: Dec. 3, 2019

(54) ANISOTROPIC CONDUCTIVE FILM AND METHOD FOR MANUFACTURING THE SAME

(71) Applicant: SAMSUNG DISPLAY CO., LTD., Yongin-si, Gyeonggi-do (KR)

(72) Inventors: Minseok Kim, Cheongju-si (KR); Yeonil Kang, Yongin-si (KR); Sunwoong Kim, Asan-si (KR); Youngmin Cho, Seongnam-si (KR); Yunhwan Jo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/202,502

(22) Filed: Jul. 5, 2016

(65) Prior Publication Data

US 2017/0013722 A1    Jan. 12, 2017

(30) Foreign Application Priority Data

Jul. 6, 2015   (KR) .................. 10-2015-0096007

(51) Int. Cl.
*H05K 3/02* (2006.01)
*C09J 7/29* (2018.01)
(Continued)

(52) U.S. Cl.
CPC ............... *C09J 7/29* (2018.01); *H01L 24/27* (2013.01); *H01L 24/29* (2013.01); *H05K 3/323* (2013.01); *C08K 2201/001* (2013.01); *C09J 2201/122* (2013.01); *C09J 2201/16* (2013.01); *C09J 2201/602* (2013.01); *C09J 2203/318* (2013.01); *C09J 2205/106* (2013.01); *G02F 1/1345* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/16227* (2013.01);
(Continued)

(58) Field of Classification Search
CPC . C09J 7/29; H01L 24/27; H01L 24/29; H05K 3/323; C08K 2201/001; G02F 1/1345
USPC ........................................... 361/749
See application file for complete search history.

(56) References Cited

U.S. PATENT DOCUMENTS 8,252,517 B2   8/2012   Thomas et al.
8,399,184 B2   3/2013   Kim et al.
(Continued)

FOREIGN PATENT DOCUMENTS

KR   10-2005-0123088 A   12/2005
KR   10-2009-0032796 A   4/2009
KR   10-2010-0066318 A   6/2010

OTHER PUBLICATIONS

Do, Yun Seon et al., "Plasmonic Color Filter and its Fabrication for Large-Area Applications", Advanced Optical Materials, 2013, pp. 133-138, vol. 1.

(Continued)

*Primary Examiner* — Tremesha S Willis
(74) *Attorney, Agent, or Firm* — Lewis Roca Rothgerber Christie LLP

(57) ABSTRACT

An anisotropic conductive film (ACF) including a base film, a support unit on the base film, the support unit defining at least one opening, at least one conductive particle in the opening, and an adhesive layer on the support unit and the conductive particle.

18 Claims, 19 Drawing Sheets

(51) Int. Cl.
*H01L 23/00* (2006.01)
*H05K 3/32* (2006.01)
*G02F 1/1345* (2006.01)
*H05K 1/18* (2006.01)

(52) U.S. Cl.
CPC .............. *H01L 2224/271* (2013.01); *H01L 2224/27003* (2013.01); *H01L 2224/2711* (2013.01); *H01L 2224/2712* (2013.01); *H01L 2224/294* (2013.01); *H01L 2224/29005* (2013.01); *H01L 2224/29011* (2013.01); *H01L 2224/2929* (2013.01); *H01L 2224/2939* (2013.01); *H01L 2224/2949* (2013.01); *H01L 2224/29076* (2013.01); *H01L 2224/29078* (2013.01); *H01L 2224/29082* (2013.01); *H01L 2224/29486* (2013.01); *H01L 2224/32227* (2013.01); *H01L 2224/73204* (2013.01); *H01L 2224/81191* (2013.01); *H01L 2224/81903* (2013.01); *H01L 2224/8388* (2013.01); *H01L 2224/83101* (2013.01); *H01L 2224/83191* (2013.01); *H01L 2224/83203* (2013.01); *H01L 2224/83851* (2013.01); *H01L 2224/83862* (2013.01); *H01L 2224/9211* (2013.01); *H05K 1/189* (2013.01); *H05K 2201/10136* (2013.01)

(56) References Cited

U.S. PATENT DOCUMENTS

| | | | |
|---|---|---|---|
| 8,652,876 B2 | 2/2014 | Kim et al. | |
| 8,685,628 B2 | 4/2014 | Raub et al. | |
| 8,802,214 B2 | 8/2014 | Liang et al. | |
| 2005/0052326 A1* | 3/2005 | Gundlach | C23C 2/02 |
| | | | 343/733 |
| 2006/0160383 A1* | 7/2006 | Yamada | G01R 1/06755 |
| | | | 439/86 |
| 2012/0295098 A1 | 11/2012 | Hwang et al. | |
| 2014/0141195 A1 | 5/2014 | Liang et al. | |
| 2014/0226139 A1 | 8/2014 | Csete et al. | |
| 2014/0312501 A1 | 10/2014 | Liang et al. | |
| 2015/0061095 A1* | 3/2015 | Choi | H01L 24/20 |
| | | | 257/675 |
| 2015/0163897 A1* | 6/2015 | Ju | H01R 13/035 |
| | | | 361/783 |

OTHER PUBLICATIONS

Seo, Jung-Hun et al., "Large-Area Printed Broadband Membrane Reflectors by Laser Interference Lithography", IEEE Photonics Journal, Feb. 2013, 7 pages, vol. 5, No. 1.
Seo, Jung-Hun et al., "Nanopatterning by Laser Interference Lithography: Applications to Optical Devices", 16 pages.
Shim, Yong Sub et al., "Nanoshuttered OLEDs: Unveiled Invisible Auxiliary Electrode", Advanced Functional Materials, 2014, pp. 6414-6421, vol. 24.

* cited by examiner

ANISOTROPIC CONDUCTIVE FILM AND METHOD FOR MANUFACTURING THE SAME

CROSS-REFERENCE TO RELATED APPLICATION

This application claims priority to and the benefit of Korean Patent Application No. 10-2015-0096007, filed on Jul. 6, 2015, with the Korean Intellectual Property Office (KIPO), the entire content of which is incorporated herein by reference.

BACKGROUND

1. Field

Aspects of embodiments of the present invention relate to an anisotropic conductive film, to a method of manufacturing the anisotropic conductive film, and to a display device including the anisotropic conductive film.

2. Description of the Related Art

Display devices are classified into liquid crystal display ("LCD") devices, organic light emitting diode ("OLED") display devices, plasma display panel ("PDP") devices, electrophoretic display ("EPD") devices, and the like, based on a light emitting scheme thereof.

In general, the display device includes a display panel for displaying an image and a circuit member for driving the display panel. The circuit member may include, for example, a driving chip or a flexible printed circuit board ("FPCB"), which are typically mounted on an edge portion of the display panel. For example, the driving chip may be directly mounted on the display panel through an anisotropic conductive film ("ACF") in a chip-on-glass ("COG") manner, or alternatively, may be mounted on a tape carrier package ("TCP") or on a flexible film in a chip-on-film ("COF") manner to be connected to the display panel through the ACF.

Recently, display devices have been developed to have high definition, which may result in a planar area of a non-display area of the display devices decreasing, and the width and the interval of wirings decreasing. Accordingly, there is a difficulty in stably aligning the circuit member on a substrate to be adhered thereto using the ACF.

It is to be understood that this background of the present disclosure is intended to provide useful background for understanding the technology disclosed herein, and as such, the technology background section may include ideas, concepts or recognitions that were not part of what was known or appreciated by those skilled in the pertinent art prior to the effective filing date of subject matter disclosed herein.

SUMMARY

Aspects of embodiments of the present invention are directed to a method of manufacturing an anisotropic conductive film having a fine pattern formed by a laser interference lithography method using an interference laser beam.

Further, aspects of embodiments of the present invention are directed to an anisotropic conductive film capable of stably attaching a circuit member to a conductive pad of a substrate.

According to an embodiment of the present invention, an anisotropic conductive film (ACF) includes: a base film; a support unit on the base film, the support unit defining at least one opening; at least one conductive particle in the at least one opening; and an adhesive layer on the support unit and the at least one conductive particle.

The support unit may include a plurality of linear patterns each having a width of about 200 nm to about 600 nm and adjacent linear patterns being spaced apart by an interval of about 200 nm to about 600 nm.

The support unit may include a mesh pattern defining a series of openings.

Each of the openings may have a cross-sectional shape such as a circular shape, an elliptical shape, or a polygonal shape.

Each of the openings may have a diameter of about 200 nm to about 600 nm.

The support unit may include a series of pillars.

The at least one conductive particle may have a particle size of about 20 nm to about 600 nm.

According to another embodiment of the present invention, an anisotropic conductive film includes: a base film; a support-unit pattern on the base film; conductive particles dispersed in the support-unit pattern; and an adhesive layer on the support-unit pattern. The support-unit pattern may have a linear stripe-shaped pattern, a mesh pattern, or a pillar pattern.

At least a portion of the conductive particles may be exposed on an upper surface of the support-unit pattern.

According to another embodiment of the present invention, a method of manufacturing an anisotropic conductive film includes: coating a photosensitive resin composition on a base film; exposing the photosensitive resin composition utilizing a laser interference lithography device; developing the exposed photosensitive resin composition to form a support unit defining an opening; filling at least one conductive particle in the opening; and disposing an adhesive layer on the support unit and the at least one conductive particle.

The exposing of the photosensitive resin composition may include irradiating the photosensitive resin composition with an interference laser beam.

The laser interference lithography device includes a laser generator and a light interference device. The light interference device including a stage on which an object to be subject to light exposure is mounted. The exposing of the photosensitive resin composition may include: disposing a base film coated with the photosensitive resin composition on the stage of the laser interference lithography device; and irradiating the photosensitive resin composition with a laser beam. The irradiating of the photosensitive resin composition with the laser beam may include: simultaneously or concurrently irradiating the photosensitive resin composition with a first laser beam having a first light-path and a second laser beam having a second light-path different from the first light-path of the first laser beam.

The light interference device may include an interference mirror, and the second laser beam may be a laser beam reflected from the interference mirror.

The laser interference lithography device may include a beam splitter and a laser generator, and the beam splitter may split the laser beam generated from the laser generator into a first laser beam and a second laser beam.

The method may further include: rotating the base film coated with the photosensitive resin composition by about 45 degrees to about 90 degrees subsequent to the irradiating of the photosensitive resin composition with the laser beam; and subsequently performing a second irradiation of the photosensitive resin composition with a laser beam.

According to another embodiment of the present invention, a method of manufacturing an anisotropic conductive film includes: coating a photosensitive resin composition including at least one conductive particle on a base film; exposing the photosensitive resin composition utilizing a laser interference lithography device; developing the exposed photosensitive resin composition to form a support unit; and disposing an adhesive layer on the support unit and the at least one conductive particle.

The exposing of the photosensitive resin composition may include irradiating the photosensitive resin composition with an interference laser beam.

According to another embodiment of the present invention, a display device includes: a substrate including a pad area; a conductive pad on the pad area; an anisotropic conductive film on the conductive pad; and a circuit member on the anisotropic conductive film, the circuit member electrically connected to the conductive pad through the anisotropic conductive film. The anisotropic conductive film may include: a support unit having at least one opening; at least one conductive particle in the at least one opening; and an adhesive layer on the support unit and the at least one conductive particle.

The support unit may have a linear stripe-shaped pattern, a mesh pattern, or a pillar pattern.

The circuit member may be one of a driving chip and a flexible printed circuit board (FPCB).

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
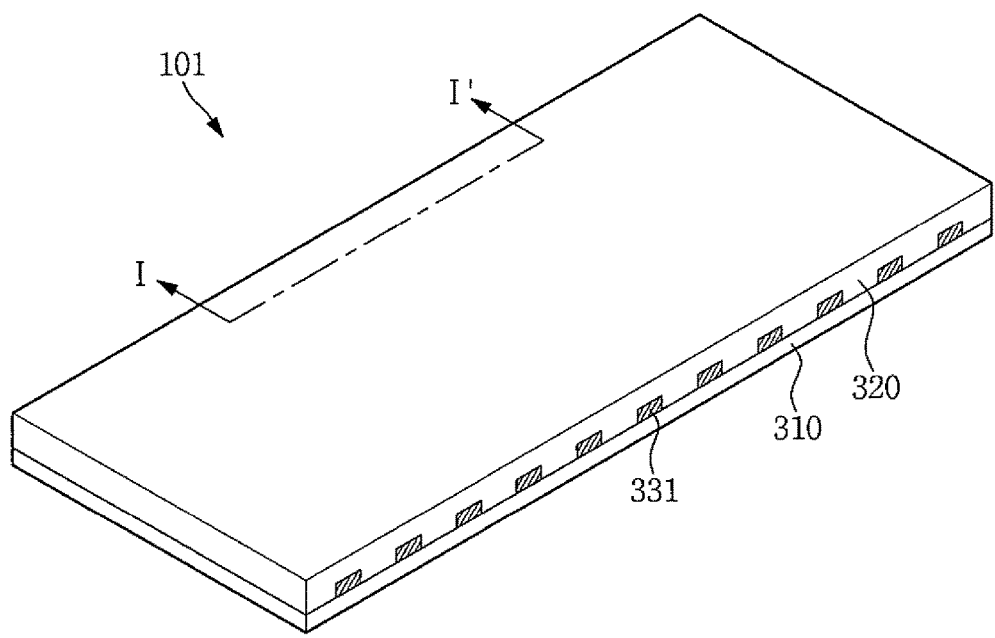
FIG. 1 is a perspective view illustrating an anisotropic conductive film according to a first exemplary embodiment.

Hereinafter, embodiments of the present invention will now be described in more detail with reference to the accompanying drawings.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent an understanding of the present invention from being obscured. Like reference numerals refer to like elements throughout the specification.

The terminology used herein is for the purpose of describing particular example embodiments only and is not intended to be limiting. Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate. It will be understood that when an element such as a layer, film, region, or substrate is referred to as being "on" another element, it can be directly on the other element or intervening element(s) may also be present. In contrast, when an element is referred to as being "directly on" another element, there are no intervening elements present.

In addition, although an organic light emitting diode ("OLED") display device including an organic light emitting layer is described as a display device according to an exemplary embodiment, the display device is not limited thereto. The display device according to the present invention may be a liquid crystal display ("LCD") device, a plasma display panel ("PDP") device, an electrophoretic display ("EPD") device, or the like.

Unless otherwise defined, all terms used herein (including technical and scientific terms) have the same meaning as commonly understood by those skilled in the art to which this invention pertains.

Hereinafter, an anisotropic conductive film 101 according to a first exemplary embodiment will be described in more detail with reference to FIGS. 1, 2, 3, and 4.

Figure 2:
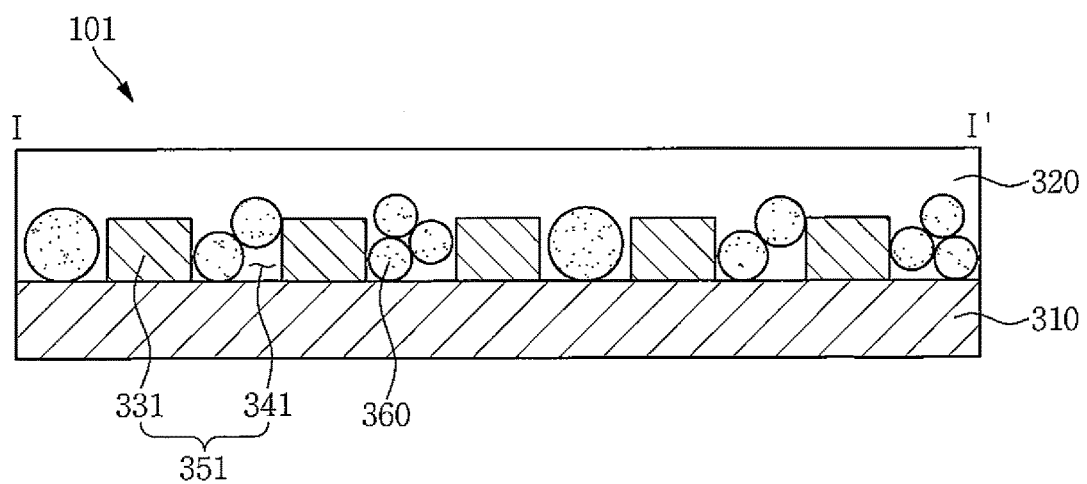
FIG. 2 is a cross-sectional view taken along line I-I' of FIG. 1.
Figure 3:
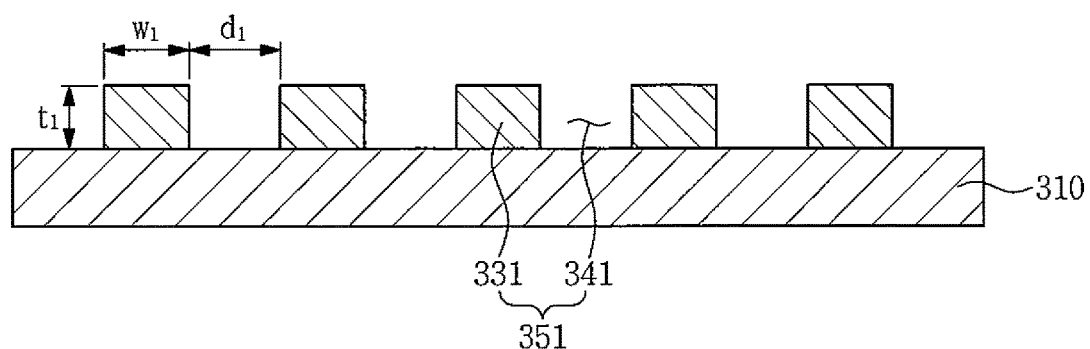
FIG. 3 is a cross-sectional view illustrating a base film and a support unit of FIG. 2.
Figure 4:
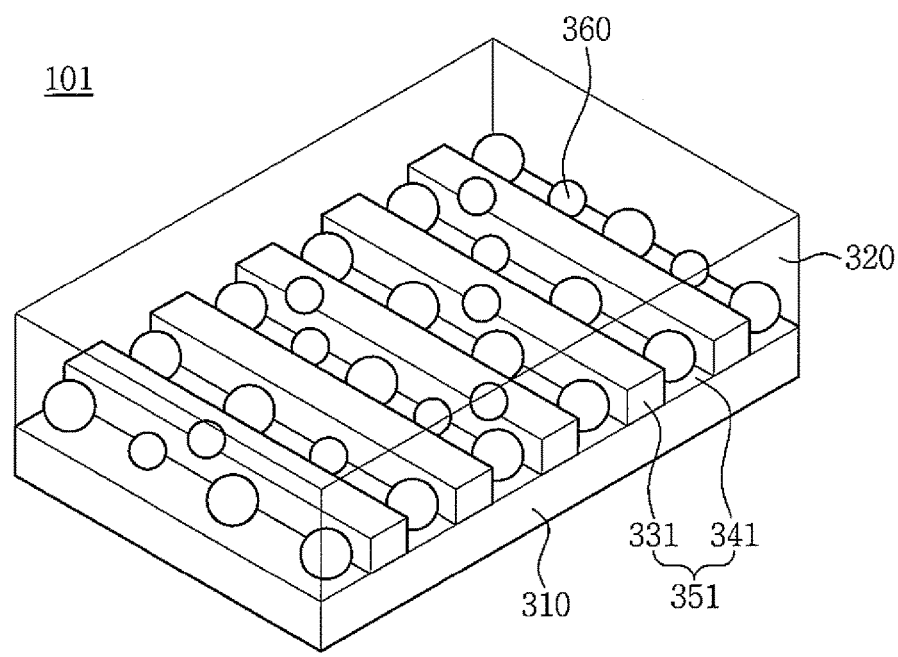
FIG. 4 is a perspective view illustrating an interior of the anisotropic conductive film of FIG. 1.

FIG. 1 is a perspective view illustrating an anisotropic conductive film 101 according to a first exemplary embodiment, FIG. 2 is a cross-sectional view taken along line I-I' of FIG. 1, FIG. 3 is a cross-sectional view illustrating a base film 310 and a support unit 351 of FIG. 2, and FIG. 4 is a perspective view illustrating an interior of the anisotropic conductive film 101 of FIG. 1.

As illustrated in FIGS. 1, 2, 3, and 4, the anisotropic conductive film 101 according to the first exemplary embodiment includes a base film 310, a support unit 351, an adhesive layer 320, and at least one conductive particle 360.

The base film 310 is attached to the adhesive layer 320, and includes or is formed of a material having flexibility. The base film 310 may be detached from the adhesive layer 320 when mounting a circuit member on a substrate. In one embodiment, the circuit member is attached to a surface of the adhesive layer 320 to which the base film 310 is not attached, the base film 310 is then detached from the adhesive layer 320, and subsequently, another surface of the adhesive layer 320 exposed by the detachment of the base film 310 is attached to the substrate, and thereby the circuit member may be mounted on the substrate.

The support unit 351 is disposed on the base film 310. According to the first exemplary embodiment, the support unit 351 includes a plurality of linear patterns 331. The linear pattern 331 is also referred to as a support-unit pattern. Herein, a space among the linear patterns 331 corresponds to an opening 341 (e.g., an opening 341 is defined between adjacent linear patterns 331). The support unit 351 is configured to control fluidity of the conductive particle 360 in a display device according to exemplary embodiments to be described below, and guide the conductive particle 360 to be disposed on the conductive pad of the substrate. Accordingly, in the process of attaching the circuit member to the conductive pad using the anisotropic conductive film 101, the conductive particle 360 may not move or escape from an initial position (i.e., the conductive particle 360 may be trapped in the initial position), and thereby a stable electric connection may be achieved.

The support unit 351 may be formed by patterning a photosensitive resin Composition through a laser interference lithography method. The support unit 351 manufactured through the laser interference lithography method may have a fine, uniform line width. Accordingly, the anisotropic conductive film 101 according to the first exemplary embodiment may stably attach the circuit member and the conductive pad having a fine wiring structure to each other. A method of manufacturing the support unit 351 will be described further below.

According to the first exemplary embodiment, the linear pattern 331 forming the support unit 351 may have a line width and an interval in nanometers (nm). In one embodiment, the support unit 351 includes the plurality of linear patterns 331 having a width w1 of approximately (or about) 200 nm to approximately (or about) 600 nm and spaced apart from one another at a distance d1 of approximately (or about) 200 nm to approximately (or about) 600 nm between adjacent patterns, as illustrated in FIG. 3.

The linear patterns 331 of the support unit 351 may have a height t1 of approximately (or about) 100 nm to approximately (or about) 600 nm. The height t1 of the linear patterns 331 of the support unit 351 may be greater than or less than a diameter of the conductive particle 360.

The adhesive layer 320 is disposed on the base film 310. The adhesive layer 320 includes an adhesive polymer resin, and when the circuit member is mounted on the substrate, the substrate and the circuit member are attached to opposite sides of the adhesive layer 320, respectively. The adhesive layer 320 may be melted or cured based on the adhesion method. For example, in one or more embodiments, the adhesive layer 320 may be melted by heat or may be cured by ultraviolet (UV) light. The melting and curing characteristics of the adhesive layer 320 may be controlled by varying the adhesion method, and the circuit member may be mounted on the substrate by controlling such melting and curing characteristics of the adhesive layer 320.

At least one conductive particle 360 is disposed in the opening 341. In one or more embodiments in which the conductive film 101 includes a series of conductive particles 360, the conductive particles 360 adjacent to each other (e.g., in adjacent openings 351) are insulated from each other by the adhesive layer 320.

Hereinafter, a second exemplary embodiment will be described with reference to FIG. 5.

Figure 5:
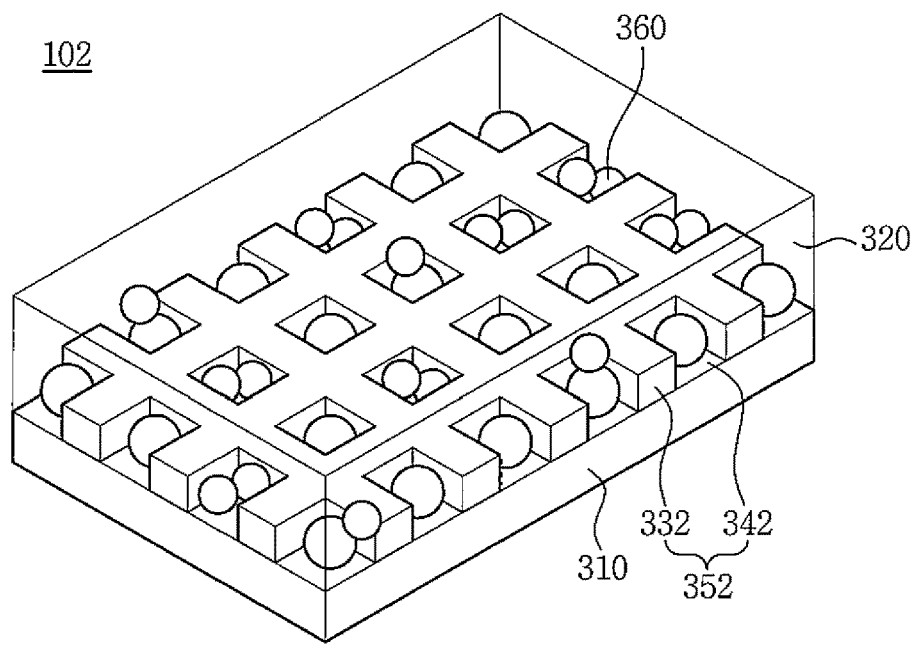
FIG. 5 is a perspective view illustrating an anisotropic conductive film according to a second exemplary embodiment.

FIG. 5 is a perspective view illustrating an anisotropic conductive film 102 according to the second exemplary embodiment. In reference to FIG. 5, the anisotropic conductive film 102 according to the second exemplary embodiment includes a support unit 352 having a mesh form. In one embodiment, the support unit 352 has a mesh pattern 332 and a plurality of openings 342 having a quadrangular shape (e.g., a square prismatic shape), and one or more conductive particles 360 are disposed in each of the openings 342.

For example, the plurality of openings may be defined to have a micro size and uniform arrangement through the laser interference lithography method. According to the second exemplary embodiment, a side of the opening 342 may have a length of approximately (or about) 200 nm to approximately (or about) 600 nm.

According to the second exemplary embodiment, one, two or more conductive particles 360 are disposed in each of the openings 342. Since the one or more conductive particles 360 are trapped in each of the opening 342s, the conductive particles 360 may not escape from the openings 342. Accordingly, when the anisotropic conductive film 102 is compressed in the process of attaching the circuit member and the conductive pad to each other using the anisotropic conductive film 102, a stable electric contact may be achieved.

Hereinafter, a third exemplary embodiment will be described with reference to FIG. 6.

Figure 6:
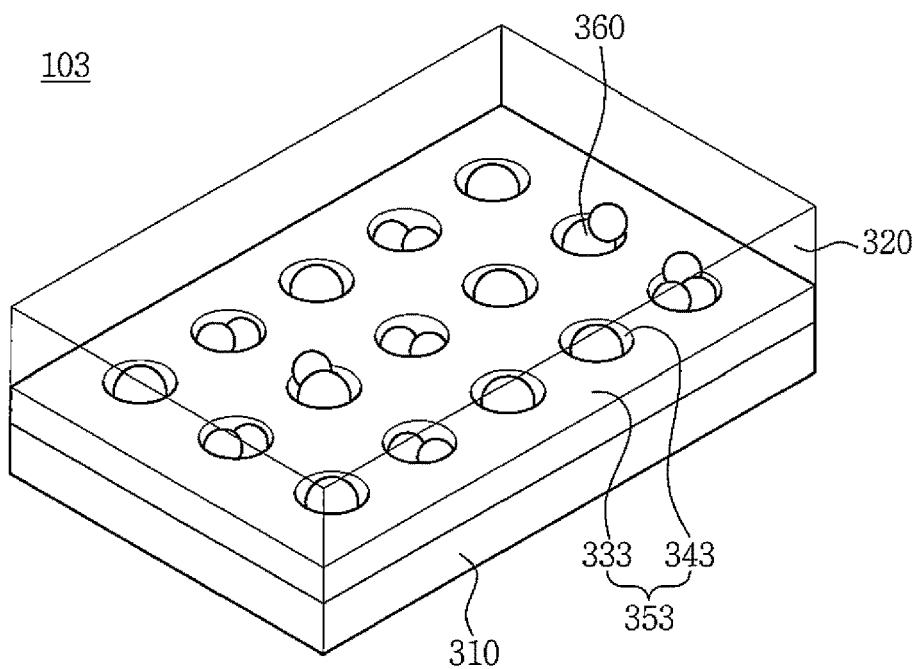
FIG. 6 is a perspective view illustrating an anisotropic conductive film according to a third exemplary embodiment.

FIG. 6 is a perspective view illustrating an anisotropic conductive film 103 according to the third exemplary embodiment.

In reference to FIG. 6, the anisotropic conductive film 103 according to the third exemplary embodiment includes a support unit 353 having a mesh form. In more detail, the support unit 353 has a mesh pattern 333 and a plurality of openings 343 having a circular shape (e.g., cylindrical shape), and one or more conductive particles 360 is disposed in each of the openings 343. Each of the openings 343 may have a diameter of approximately (or about) 200 nm to approximately (or about) 600 nm.

While the openings 342 and 343 are described as having the quadrangular shape (e.g., square prismatic shape) and the circular shape (e.g., cylindrical shape) in the second exemplary embodiment and the third exemplary embodiment, respectively, the present invention is not limited thereto. The openings 342, 343 may have various polygonal cross-sectional shapes (such as a triangular shape, a pentagonal shape, and/or a hexagonal shape), and a side wall of the opening may be inclined.

Hereinafter, a fourth exemplary embodiment will be described with reference to FIG. 7.

Figure 7:
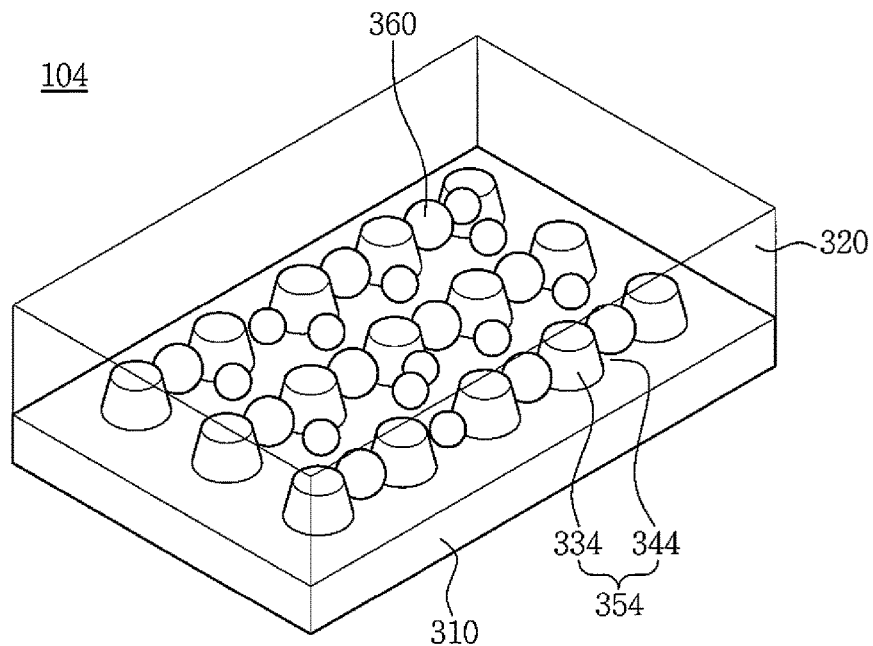
FIG. 7 is a perspective view illustrating an anisotropic conductive film according to a fourth exemplary embodiment.

FIG. 7 is a perspective view illustrating an anisotropic conductive film 104 according to the fourth exemplary embodiment. In reference to FIG. 7, the anisotropic conductive film 104 according to the fourth exemplary embodiment includes a plurality of pillars (e.g., projections or protrusions) 334 spaced apart from one another. That is, a support unit 354 according to the fourth exemplary embodiment includes the plurality of pillars 334 and an opening or space 344 defined between adjacent pillars 334 (e.g., the support unit 354 defines a series of openings or spaces 344 between the pillars 334). For example, the pillar 334 has a shape protruding from the opening 344. The conductive particles 360 are disposed in the openings 344 among the pillars 334.

Hereinafter, a fifth exemplary embodiment will be described with reference to FIG. 8.

Figure 8:
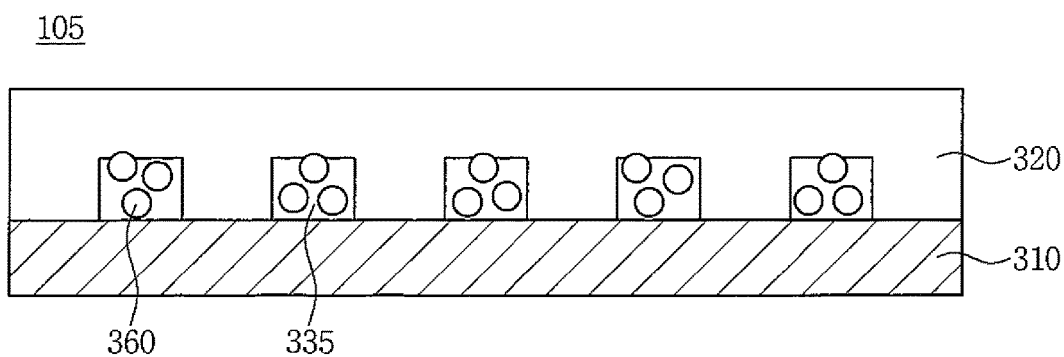
FIG. 8 is a cross-sectional view illustrating an anisotropic conductive film according to a fifth exemplary embodiment.

FIG. 8 is a cross-sectional view illustrating an anisotropic conductive film 105 according to the fifth exemplary embodiment.

The anisotropic conductive film 105 according to the fifth exemplary embodiment includes a base film 310, a support-unit pattern 335 on the base film 310, conductive particles 360 dispersed or disposed in the support-unit pattern 350, and an adhesive layer 320 on the support-unit pattern 335.

The support-unit pattern 335, for example, may be formed in the following manner: a photosensitive resin composition including the conductive particles 360 is coated on the base film 310; and the photosensitive resin composition is exposed and developed through a laser interference lithography method.

The support-unit pattern 335 may include a series of parallel linear members or rods defining a stripe-shaped pattern, a mesh pattern, or a series of pillars (e.g., projections or protrusions) defining a pillar pattern. Further, at least a part or portion of the conductive particles 360 may be exposed on an upper surface of the support-unit pattern 335.

As illustrated in the first to fifth exemplary embodiments, the support unit may be manufactured into various shapes. The shape of the support unit may be determined based on the conductive pad of the substrate, a bump or shape of the circuit member, and a mounting area of the circuit member.

In one embodiment, each of the conductive particles 360 includes a core formed of a polymer and a conductive layer surrounding the core. In addition, the conductive particles 360 may further include an insulating layer surrounding the conductive layer.

The conductive particles 360 may have a particle size of approximately (or about) 20 nm to approximately (or about) 600 nm. The conductive particles 360 may be disposed in the openings 341, 342, 343, and 344 of the support units 351, 352, 353, and 354 (the first to fourth exemplary embodiments), or may be dispersed or disposed (at least partially) in the support-unit pattern 335 (the fifth exemplary embodiment).

Figure 9A:
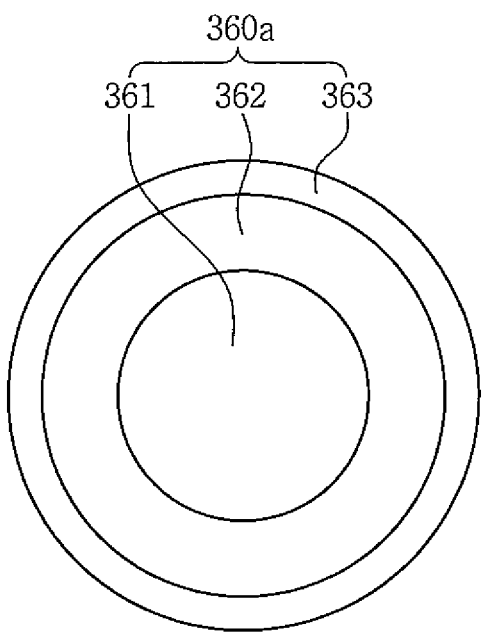
FIGS. 9A-9B are cross-sectional views illustrating conductive particles, respectively.
Figure 9B:
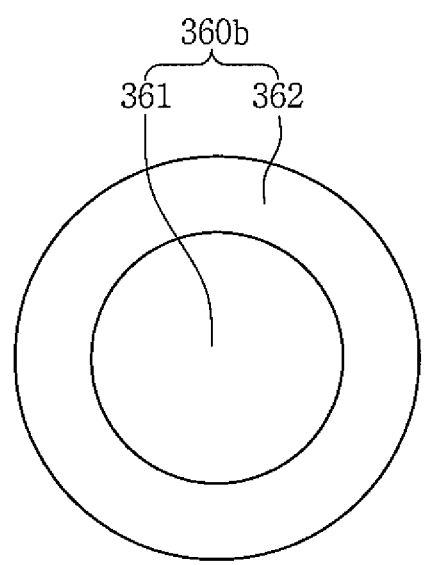

FIGS. 9A and 9B are cross-sectional views illustrating conductive particles 360a and 360b, respectively.

The conductive particle 360a of FIG. 9A includes a core 361 formed of a polymer, a conductive layer 362 surrounding the core 361, and an insulating layer 363 surrounding the conductive layer 362. The core 361 formed of a polymer has elasticity to allow the conductive particle 360a to be deformed under pressure, and the insulating layer 363 protects the conductive layer 362 in the process of manufacturing the anisotropic conductive film.

In the process of attaching the circuit wiring and the conductive pad using the anisotropic conductive film, the anisotropic conductive film is compressed and heated, the core 361 of the conductive particle 360 is compressed and the insulating layer 363 is melted, and thereby a stable electric connection may be achieved between the circuit wiring and the conductive pad.

The conductive particle 360b of FIG. 9B includes a core 361 formed of a polymer and a conductive layer 362 surrounding the core 361. The insulating layer 363 illustrated in FIG. 9A may be omitted.

Figure 10A:
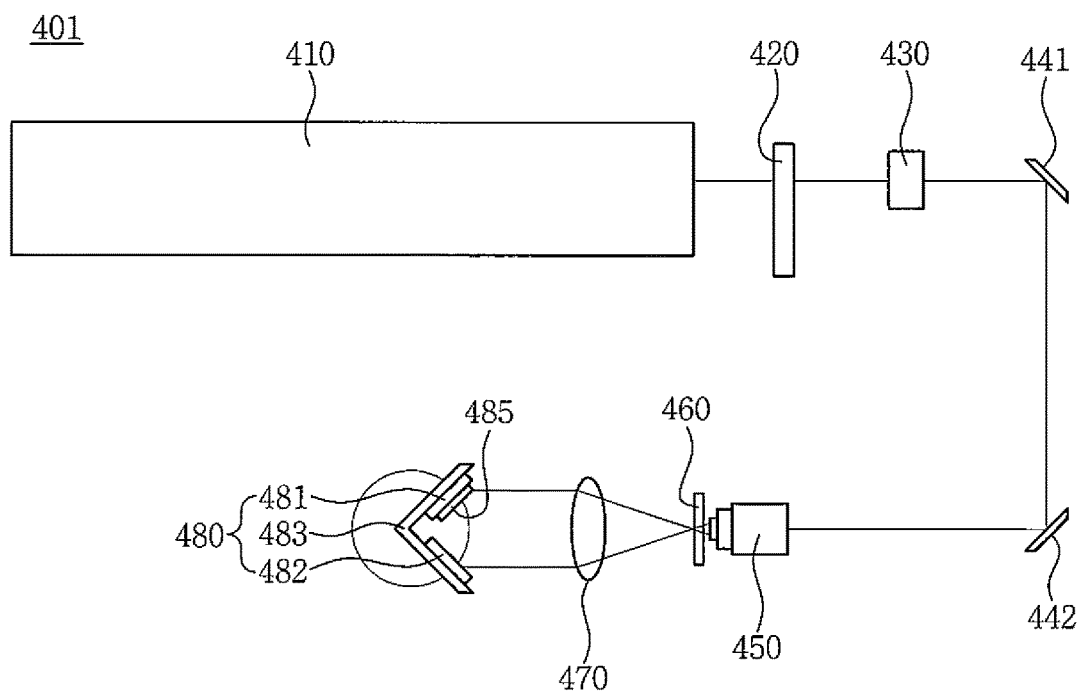
FIGS. 10A-10B are schematic views illustrating laser interference lithography devices, respectively.
Figure 10B:
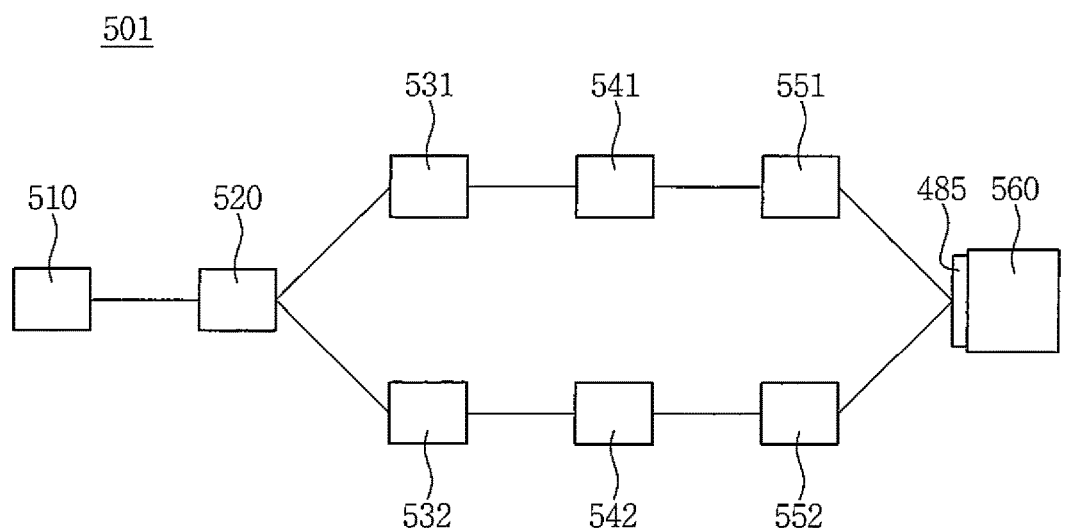

FIGS. 10A and 10B are schematic views illustrating laser interference lithography devices 401 and 501, respectively.

The laser interference lithography devices 401 and 501 are used in formation of the support unit 351, 352, 353, 354, 335. For example, a photosensitive resin composition is coated on the base film, the photosensitive resin composition is exposed and then developed by the laser interference lithography device, and thereby the support unit including the photosensitive resin composition may be formed.

The laser interference lithography device 401 illustrated in FIG. 10A includes a laser generator 410, a light-amount adjusting filter 420, a shutter 430, a first mirror 441, a second mirror 442, an object lens 450, a pinhole 460, a collimated-light lens 470, and a light interference device 480.

The laser generator 410 is configured to generate a laser beam. The generated laser beam is incident to the light-amount adjusting filter 420. The amount of the laser beam is adjusted by the light-amount adjusting filter 420.

The shutter 430 controls an exposure time of the laser beam. In a case where there is a need for adjusting the exposure time of the laser beam, the exposure time may be adjusted by adjusting the opening and closing time of the shutter 430.

The laser beam, which may be adjusted in terms of the exposure time by being transmitted through the shutter 430, is adjusted in terms of a propagation direction by the first mirror 441 and the second mirror 442. The first mirror 441 and the second mirror 442 may be selectively used. That is, in a case where an additional directional adjustment is unnecessary and a sudden change in the propagating direction of the light is not required, the mirrors may not be used or only one of the mirrors may be used. In addition, three or more mirrors may be used as necessary.

The laser beam passing through the first mirror 441 and the second mirror 442 is incident to the object lens 450.

The laser beam passing through the object lens 450 passes through the pinhole 460, and is incident on the collimated-light lens 470. The collimated-light lens 470 converts the laser beam being transmitted through the pinhole 460 into a collimated fight beam. The fight passing through the collimated-light lens 470 is incident on a stage 481 of the light interference device 480 on which an object (e.g., an experimental subject) 485 to be subjected to the light is disposed.

The light interference device 480 includes the stage 481 (on which an object to be subjected to light exposure is mounted), and an interference mirror 482. The stage 481 and the interference mirror 482 are supported by a support plate 483. The object 485 that is to be subjected to light exposure is disposed on the stage 481.

The light interference device 480 has a structure that may rotate the object 485 in a set or predetermined direction. That is, the stage 481 of the light interference device 480 may be equipped to be able to rotate about an axis that is perpendicular (or normal) to a planar surface, and accordingly, the object 485 on the stage 481 may be rotated in a set or predetermined direction.

In addition, the light interference device 480 includes the interference mirror 482, which causes a set or predetermined light-path difference between a first laser beam that is directly incident to the object 485 from the collimated-light lens 470 and a second laser beam that propagates (e.g., reflected) via the interference mirror 482. The first laser beam directly incident to the object 485 may also be referred to as direct collimated light, and the second laser beam propagating via the interference mirror 482 may also be referred to as retarded collimated light.

A laser interference phenomenon occurs in the object 485 due to the light-path difference between the direct collimated light, that is, the first laser beam, and the retarded collimated light, that is, the second laser beam. An interference light formed by the interference phenomenon of the laser beams is referred to as an interference laser beam. The interference laser beam is irradiated to the object 485.

The laser interference lithography device 501 of FIG. 10B includes a laser generator 510, a beam splitter 520, a first mirror 531, a first filter 541, a first lens 551, a second mirror 532, a second filter 542, a second lens 552, and a light interference device 560.

The laser generator 510 generates a laser beam. The generated laser beam is divided into a first laser beam and a second laser beam by the beam splitter 520. The first laser beam is irradiated or propagated to the light interference device 560 (e.g., a laser interference device) through the first mirror 531, the first filter 541, and the first lens 551. The second laser beam is irradiated or propagated to the light interference device 560 through the second mirror 532, the second filter 542, and the second lens 552. The light interference device 560 includes a stage on which the object (e.g., the experimental subject) 485 to be subjected to light exposure is mounted, and the object 485 to be subjected to light exposure is disposed on the light interference device 560.

Figure 11:
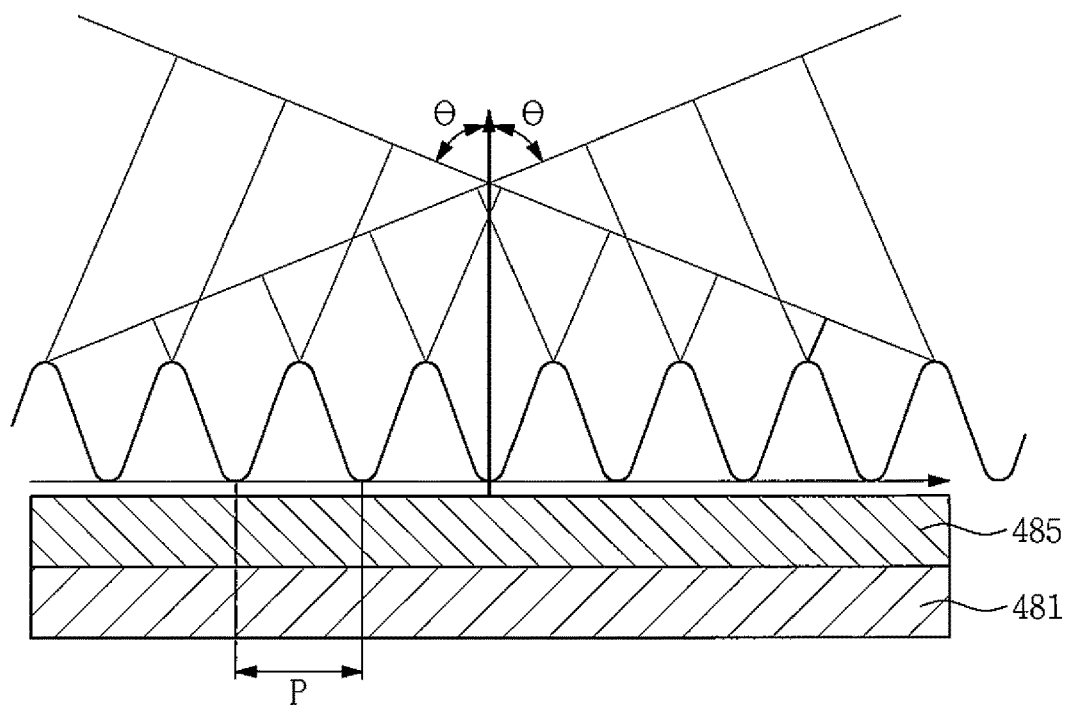
FIG. 11 is a schematic view illustrating a laser interference phenomenon.

FIG. 11 is a schematic view illustrating a laser interference phenomenon.

The first laser beam and the second laser beam having different paths causes an interference phenomenon on a surface of the object 485. In one embodiment, an incident angle θ of the two laser beams incident the object 485 may be adjusted to be the same as each other.

With regard to the interference laser beam formed by the interference phenomenon of the first laser beam and the second laser beam, at a portion at which a crest of the wave of the interference laser beam meets another crest thereof or a trough thereof meets another trough thereof to result in an increase in magnitude, constructive interference occurs. At a portion at which a crest thereof meets a trough thereof to result in a significant decrease in magnitude, destructive interference occurs. In FIG. 11, a wave P of the interference laser beam generated by the interference phenomenon is determined by the following Mathematical Formula 1.

$$P = \lambda/2 \sin \theta \qquad \text{Mathematical Formula 1}$$

In the Mathematical Formula 1, "λ" denotes a wavelength of a collimated light, and "θ" denotes an incident angle of two laser beams.

According to an exemplary embodiment, argon ion laser having a wavelength of approximately (or about) 257 nm may be used.

Figure 12A:
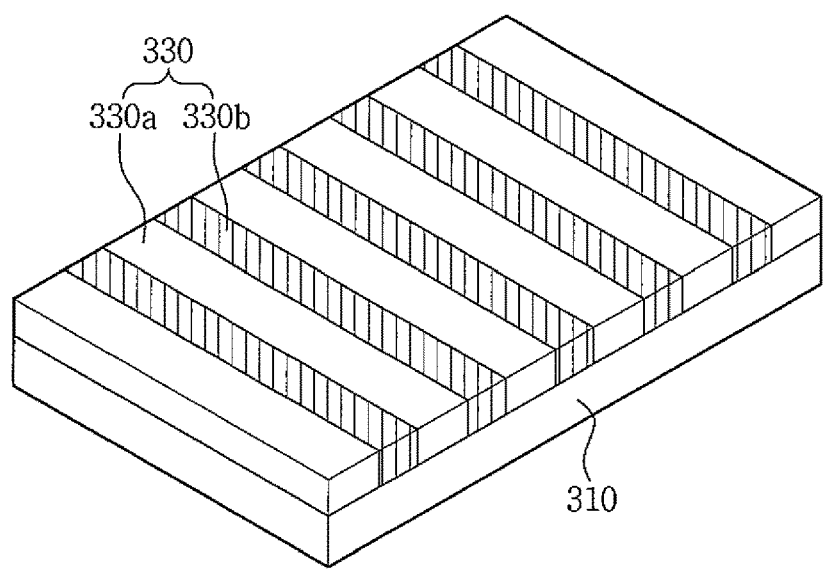
FIGS. 12A-12B are perspective views illustrating results from light exposure using an interference laser beam, respectively.
Figure 12B:
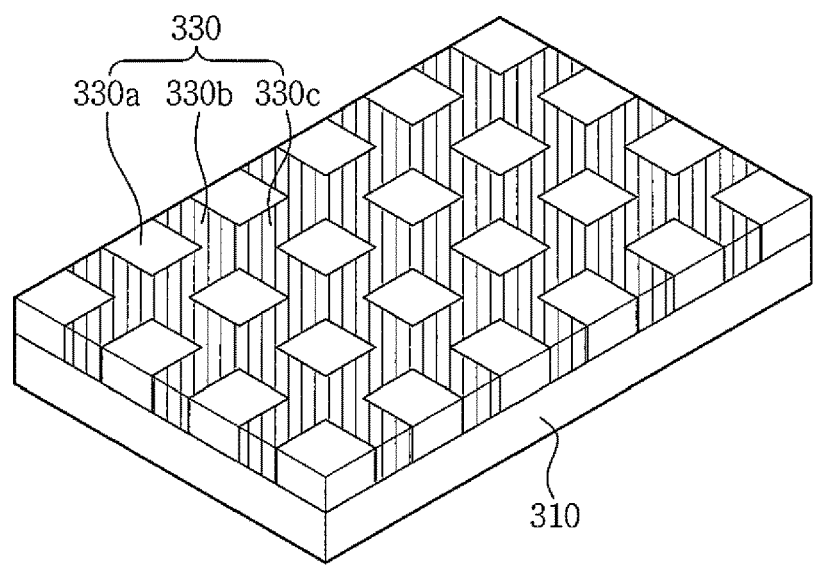
Figure 12C:
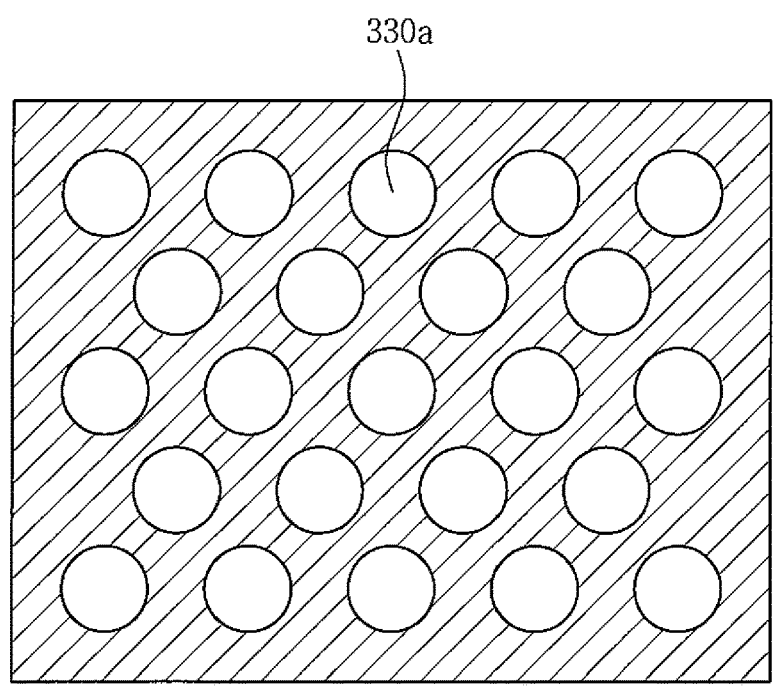
FIG. 12C is a plan view illustrating a result from light exposure using the interference laser beam.

FIGS. 12A and 12B are perspective views illustrating results from light exposure using the interference laser beam, respectively, and FIG. 12C is a plan view illustrating a result from light exposure using the interference laser beam.

Firstly, in reference to FIG. 12A, subsequent to coating the photosensitive resin composition 330 on the base film 310, the first laser beam and the second laser beam that are parallel to each other are irradiated to the photosensitive resin composition 330. Due to the first laser beam and the second laser beam, the constructive interference and the destructive interference repeatedly occur on the photosensitive resin composition 330.

As the interference laser beam generated by the first laser beam and the second laser beam parallel to each other are irradiated to the photosensitive resin composition 330, a plurality of linear patterns, that is, stripe-shaped patterns 330a and 330b are formed on a surface of the photosensitive resin composition 330. The stripe-shaped patterns 330a and 330b include a linear non-exposed portion 330a corresponding to a destructive interference area and a linear exposed portion 330b corresponding to a constructive interference area. A total width of a pair of one of the non-exposed portions 330a and one of the exposed areas 330b corresponds to the wavelength P of the interference laser beam.

FIG. 12B illustrates a pattern formed by performing a first task of irradiating the photosensitive resin composition 330 with the interference laser beam, rotating the photosensitive resin composition 330 by 90 degrees, and subsequently, performing a second task of irradiating the photosensitive resin composition 330 with the interference laser beam. Firstly, a horizontal pattern 330b is formed by the first irradiation of the photosensitive resin composition 330 with the interference laser beam, and a vertical pattern is formed by the second irradiation of the photosensitive resin composition 330 with the interference laser light. At a portion 330c at which the constructive interference in a vertical direction and the constructive interference in a horizontal direction intersect each other, the light exposure is intensively performed.

FIG. 12C is a plan view illustrating a result from light exposure in which the photosensitive resin composition 330 is irradiated with the interference laser beam a first time, the photosensitive resin composition 330 is rotated by 60 degrees, and subsequently, the photosensitive resin composition 330 is irradiated with the interference laser beam a second time.

The stripe pattern formed by the first irradiation of the interference laser beam and the stripe pattern formed by the second irradiation of the interference laser beam combine to form a final pattern.

In this regard, methods of rotating the photosensitive resin composition 330 by a set or predetermined angle to obtain the patterns of FIGS. 12A, 12B, and 12C include rotating the light interference device 480 (FIG. 10A) on which the photosensitive resin composition 330 is disposed and rotating the photosensitive resin composition 330.

In addition, incident angles of the first laser beam (direct collimated light) and the second laser beam (retarded collimated light) may be adjusted, respectively, so as to adjust an interval among the patterns illustrated in FIGS. 12A, 12B, and 12C.

The photosensitive resin composition 330 includes a negative-type (negative processed) photosensitive resin composition and a positive-type (positive processed) photosensitive resin composition. In the case of the negative-type photosensitive resin composition, an exposed portion is cross-linked and polymerized by the light exposure, such that only the exposed portion remains in a subsequent developing process. On the other hand, in the case of the positive-type photosensitive resin composition, a polymer that is cross-linked by the light exposure is decomposed or disintegrated, such that the exposed portion is removed in the developing process.

Accordingly, various shapes of patterns may be formed based on the type of the photosensitive resin composition. For example, in a case where the negative-type photosensitive resin composition is used in a pattern-forming process illustrated in FIGS. 12A, 12B, and 12C, a plurality of patterns having a shape of a pillar or a projection or a protrusion that are regularly arranged may be formed, or an opening may be defined through the developing process. In a case where the positive-type photosensitive resin composition is used, a plurality of regularly arranged openings may be defined or a pillar (e.g., a projection or a protrusion) may be formed on the substrate through the developing process.

The photosensitive resin composition may use photosensitive resin compositions known in the pertinent art. For example, a photosensitive resin composition including a monomer, an oligomer, a binder, an additive, a photoinitiator may be used. An example of the photosensitive resin composition includes a photoresist. The photosensitive resin composition may include a monomer, an oligomer, and a polymer based on epoxy, and/or may include a monomer, an oligomer, and a polymer based on acrylic.

The support units 351, 352, 353, and 354 illustrated in FIGS. 13, 14, 15, and 16 are formed through the laser interference lithography method using the photosensitive resin composition.

FIGS. 13, 14, 15, and 16 are perspective views illustrating structures of a support unit, respectively.

Figure 13:
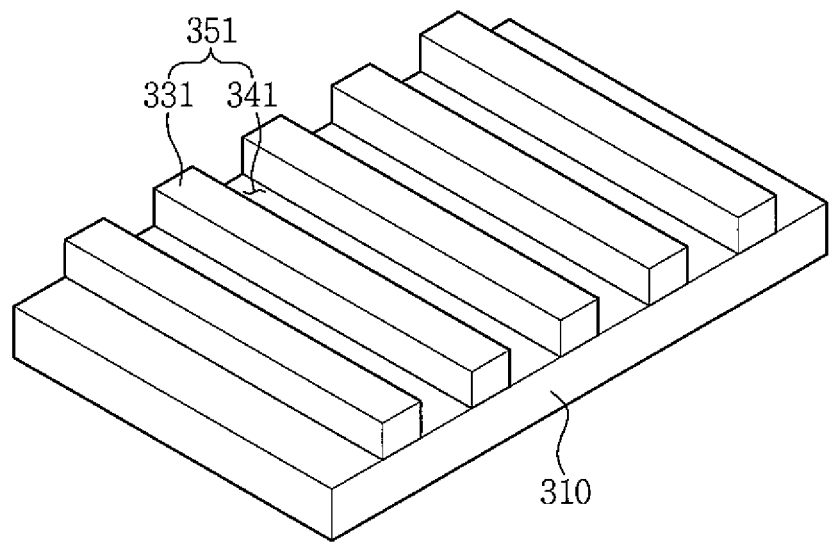
FIGS. 13, 14, 15, and 16 are perspective views illustrating structures of a support unit, respectively.
Figure 14:
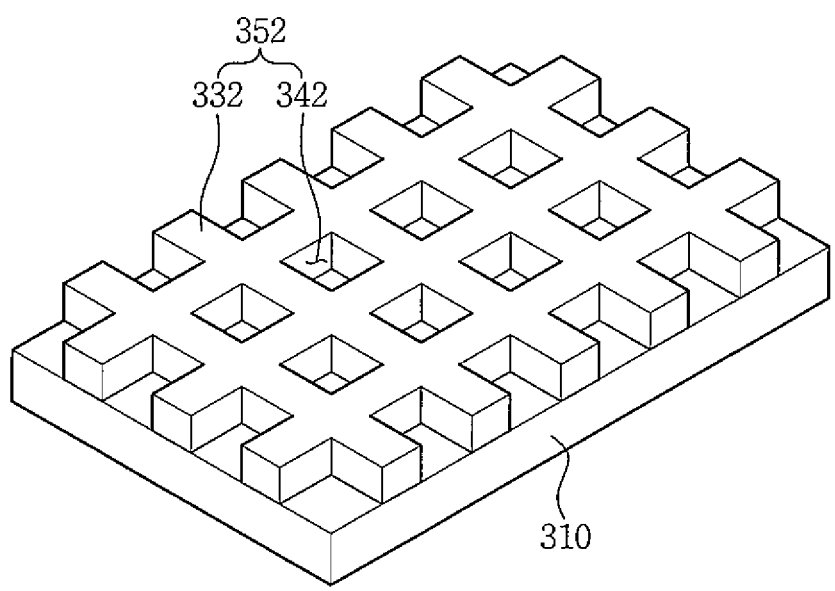
Figure 15:
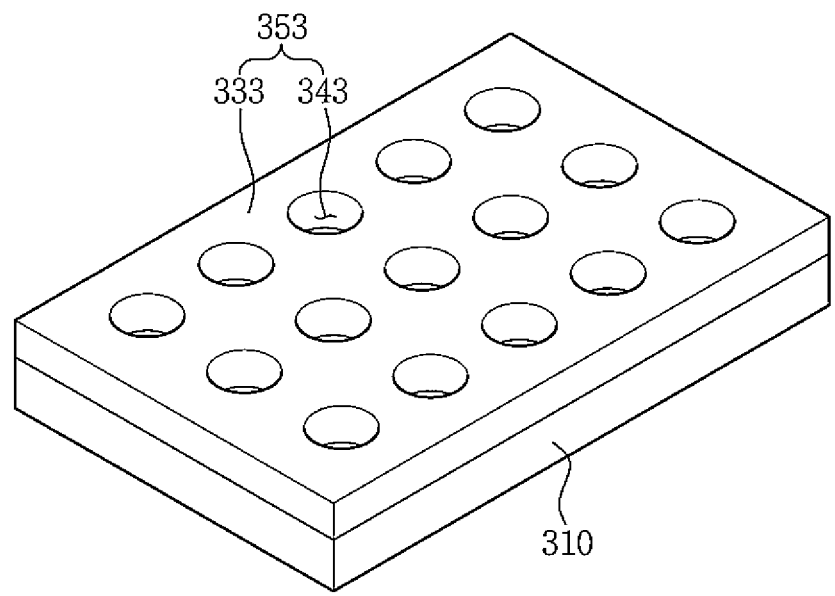
Figure 16:
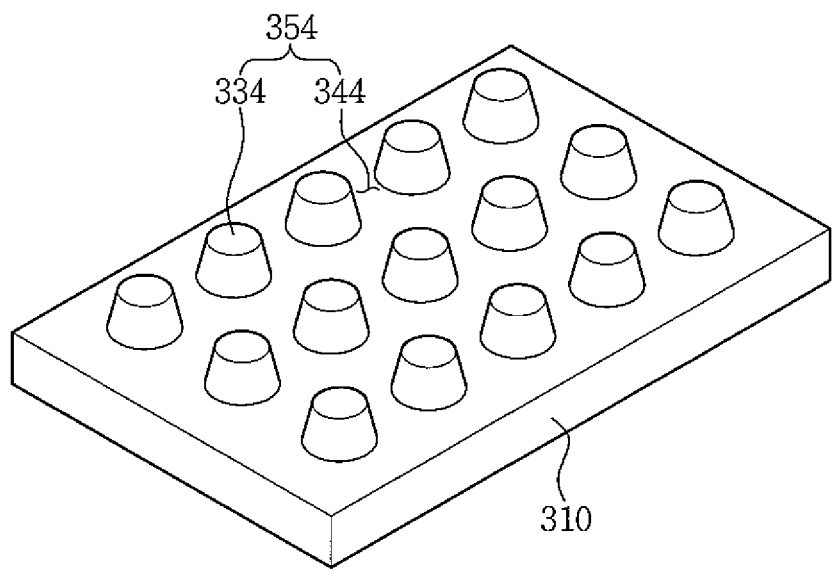

FIG. 13 is the support unit 351 of the anisotropic conductive film 101 according to the first exemplary embodiment; FIG. 14 is the support unit 352 of the anisotropic conductive film 102 according to the second exemplary embodiment; FIG. 15 is the support unit 353 of the anisotropic conductive film 103 according to the third exemplary embodiment; and FIG. 16 is the support unit 354 of the anisotropic conductive film 104 according to the fourth exemplary embodiment.

Hereinafter, a method of manufacturing the anisotropic conductive film 101 according to the first exemplary embodiment will be described with reference to FIGS. 17A to 17F. So as to avoid repetition, descriptions of the configurations described in the foregoing description will be omitted.

FIGS. 17A to 17F are views illustrating a process of manufacturing the anisotropic conductive film 101 according to the first exemplary embodiment.

Figure 17A:
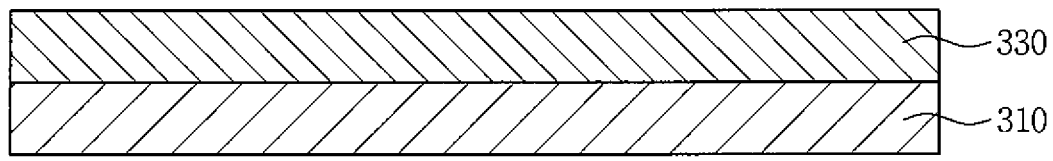
FIGS. 17A-17F are views illustrating a process of manufacturing the anisotropic conductive film according to the first exemplary embodiment.

In reference to FIG. 17A, the photosensitive resin composition 330 is coated on the base film 310. The base film 310 is formed of a material having flexibility. The photosensitive resin composition 330 includes, for example, a monomer, an oligomer, a binder, an additive, and/or a photoinitiator. The photosensitive resin composition 330 may use one of a negative-type photosensitive resin composition and a positive-type photosensitive resin composition.

Figure 17B:
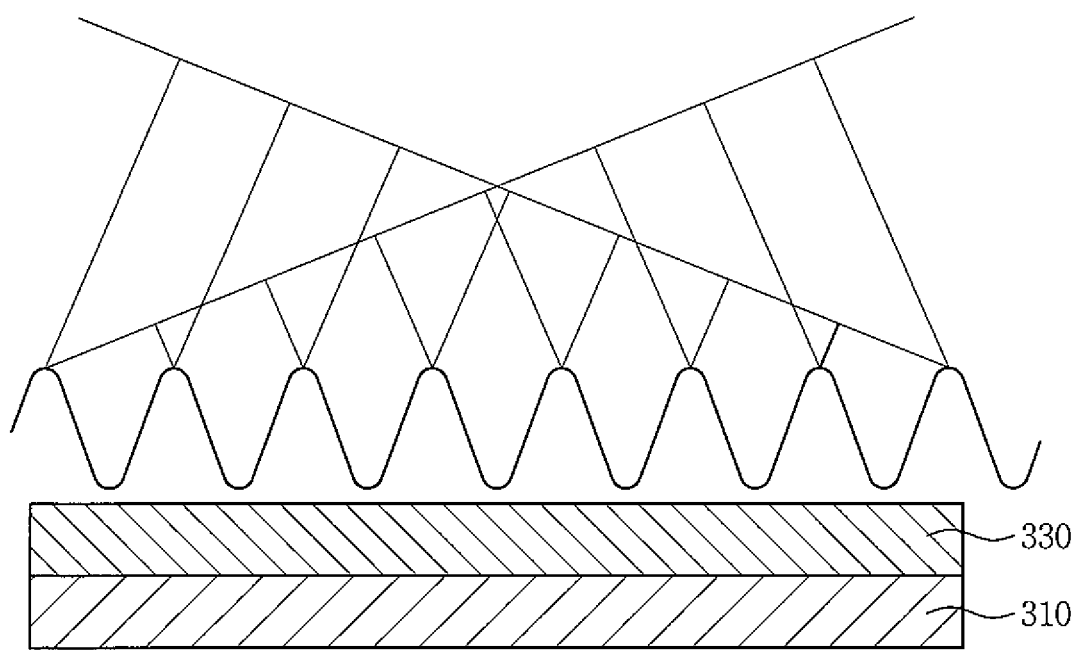

In reference to FIG. 17B, the photosensitive resin composition 330 is irradiated with a laser beam. The laser interference lithography device 401 illustrated in FIG. 10A may be used to perform light exposure. A surface of the photosensitive resin composition 330 is irradiated with the interference laser beam by the laser interference lithography device 401 to allow the photosensitive resin composition 330 to be exposed.

In one embodiment, the base film 310 coated with the photosensitive resin composition 330 is disposed on the stage 481 of the laser interference lithography device 401, and the photosensitive resin composition 330 is irradiated with the laser beam. In this case, the first laser and the second laser (that has a light-path different from that of the first laser beam) are concurrently or simultaneously irradiated to the photosensitive resin composition 330. Accordingly, the interference laser beam is formed, and thereby the light exposure is performed by the interference laser beam.

In one embodiment, argon ion laser having a wavelength of approximately (or about) 257 nm may be used.

Subsequent to irradiating the laser beam (i.e., the first laser irradiation), the base film 310 coated with the photosensitive resin composition 330 is rotated by about 45 degrees to about 90 degrees, and then the photosensitive resin composition 330 is radiated with the laser beam a second time (i.e., a second laser irradiation). The photosensitive resin composition 330 may be irradiated with the laser beam two or more times.

Figure 17C:
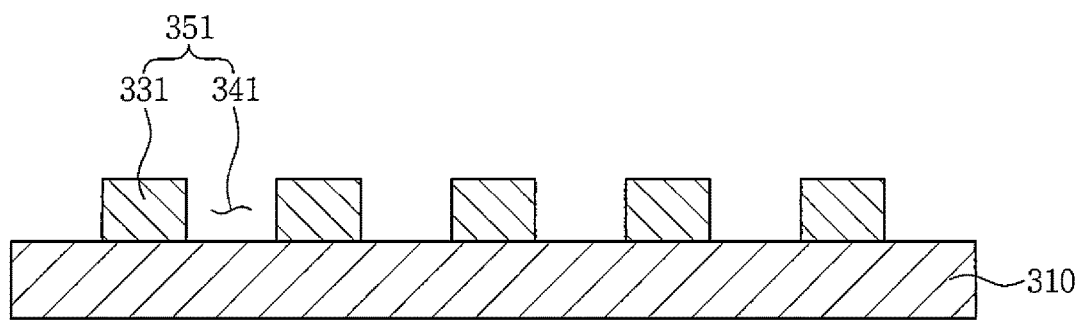

In reference to FIG. 17C, the exposed photosensitive resin composition 330 is developed to form the support unit 351 having the plurality of linear patterns (e.g., stripe-shaped pattern) 331 and the openings 341.

Figure 17D:
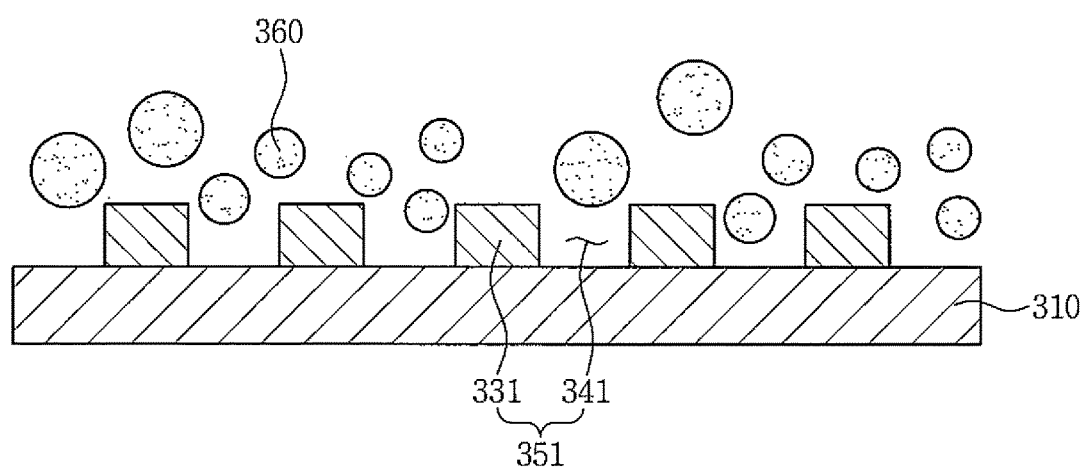

In reference to FIG. 17D, the conductive particles 360 are coated on the support unit 351. The conductive particles 360 may be coated on the support unit 351 while being dispersed in a dispersion composition. The dispersion composition may include, for example, a binder composition.

Figure 17E:
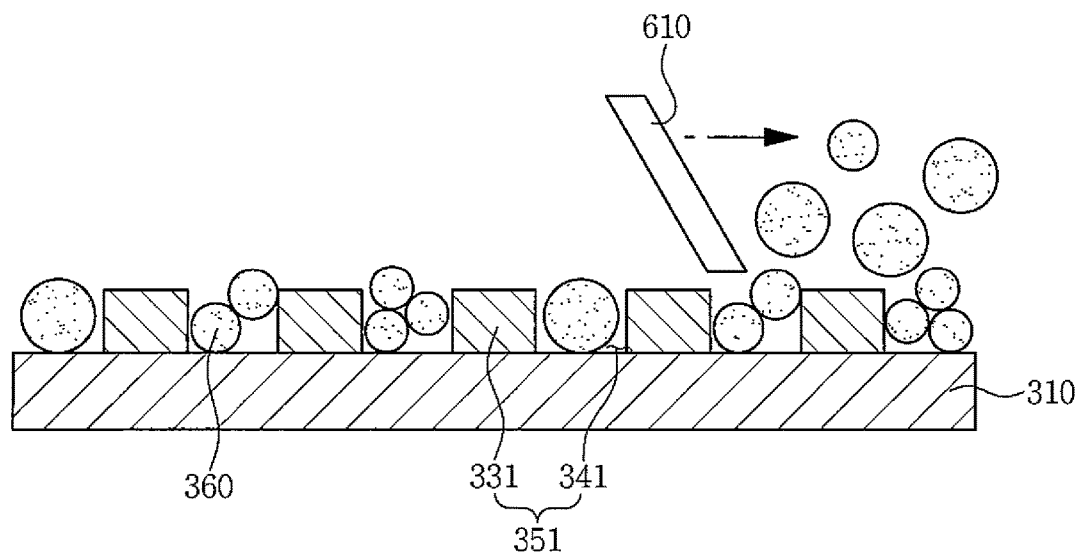

In reference to FIG. 17E, the conductive particles 360 are filled in the openings 341 of the support unit 351. In order to fill the conductive particles 360, a blade 610 may be used. The conductive particles 360 are pushed into the openings 341 using the blade 610, such that the openings 341 may be filled with the conductive particles 360. In a case where only a required amount of the conductive particles 360 are filled in the openings 341, only the required amount of the conductive particles 360 are consumed, such that the consumed amount of the conductive particles 360 may be reduced (e.g., minimized).

Figure 17F:
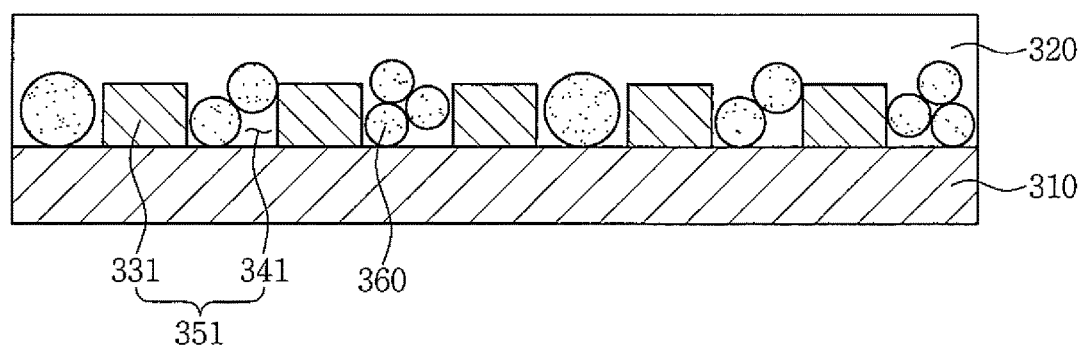

In reference to FIG. 17F, the adhesive layer 320 is disposed on the support unit 351 and the conductive particles 360. The adhesive layer 320 may serve to attach components to each other.

FIGS. 18A to 18D are views illustrating a process of manufacturing the anisotropic conductive film 105 according to the fifth exemplary embodiment.

Figure 18A:
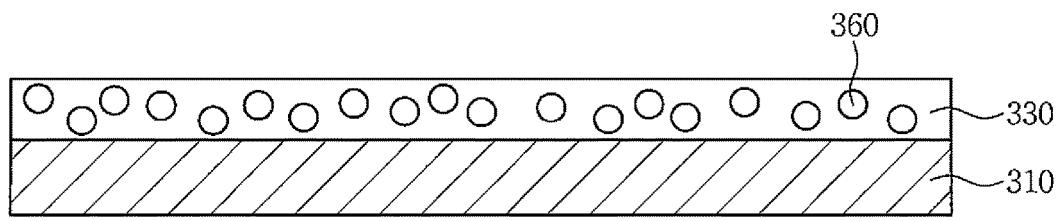
FIGS. 18A-18D are views illustrating a process of manufacturing the anisotropic conductive film according to the fifth exemplary embodiment.

In reference to FIG. 18A, the photosensitive resin composition 330 including the conductive particles 360 is coated on the base film 310.

Figure 18B:
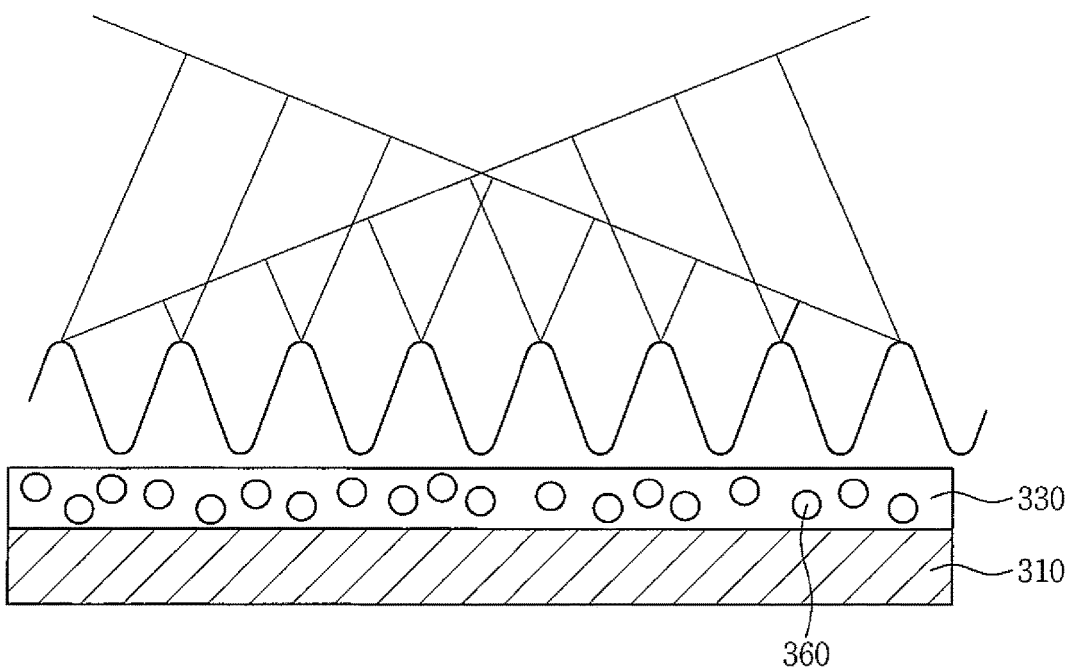

In reference to FIG. 18B, the photosensitive resin composition 330 is irradiated with the interference laser beam by the laser interference lithography device 401, such that the photosensitive resin composition 330 is exposed to the interference laser beam.

Figure 18C:
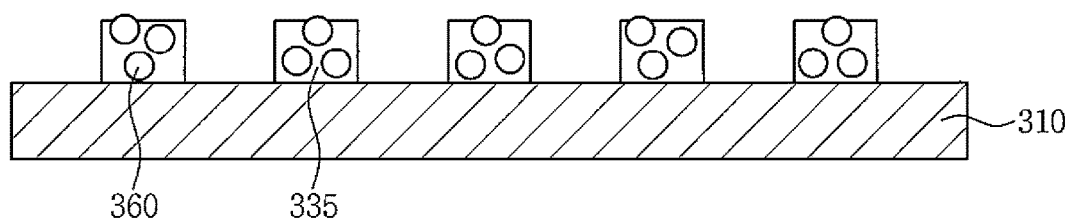

In reference to FIG. 18C, the exposed photosensitive resin composition 330 is developed to thereby form the support-unit pattern 335. The support-unit pattern 335 includes the conductive particles 360, and at least a part or a portion of the conductive particles 360 are exposed from the support-unit pattern 335 (e.g., at least a part or portion of the conductive particles 360 may be exposed on an upper surface of the support-unit pattern 335).

Figure 18D:
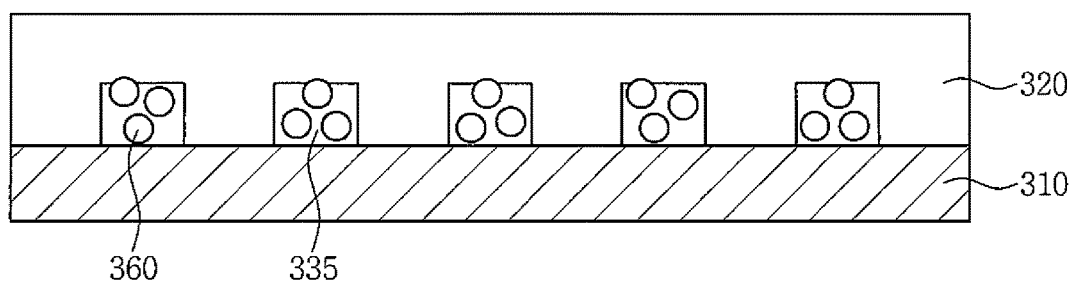

Subsequently, in reference to FIG. 18D, the adhesive layer 320 is disposed (e.g., formed) on the support-unit pattern 335 and the conductive particles 360.

Hereinafter, a display device 106 according to a sixth exemplary embodiment will be described with reference to FIGS. 19 to 24. The display device according to the sixth exemplary embodiment includes the anisotropic conductive film 101 according to the first exemplary embodiment described above. In addition, an OLED display device will be described, by way of example, as the display device according to the sixth exemplary embodiment.

Figure 19:
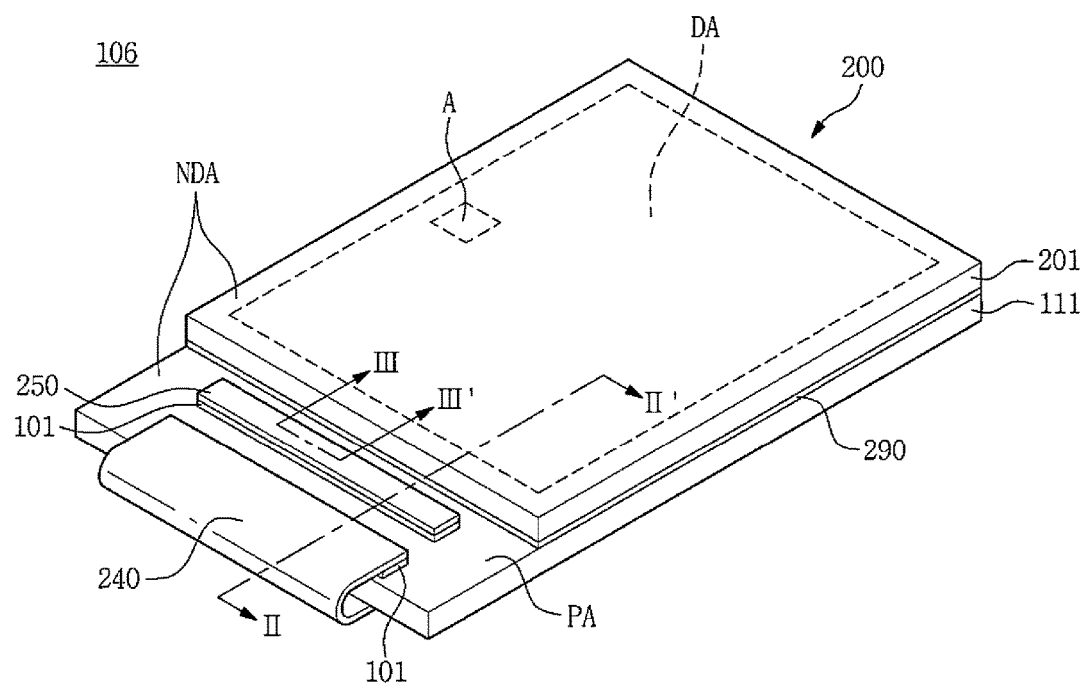
FIG. 19 is a perspective view illustrating a display device according to a sixth exemplary embodiment.
Figure 20:
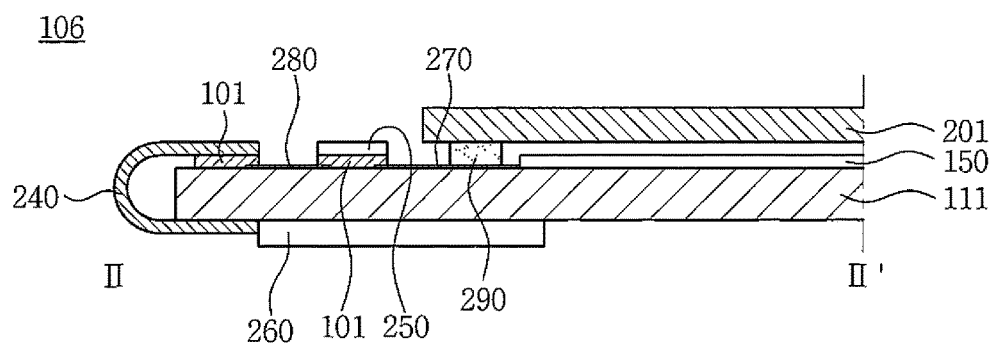
FIG. 20 is a cross-sectional view taken along line II-II' of FIG. 19.

FIG. 19 is a perspective view illustrating the display device 106 according to a sixth exemplary embodiment; and FIG. 20 is a cross-sectional view taken along line II-II' of FIG. 19.

In reference to FIGS. 19 and 20, the OLED display device 106 according to the sixth exemplary embodiment includes a display panel 200, a flexible printed circuit board ("FPCB") 240, a printed circuit board ("PCB") 260, a driving chip 250, and the anisotropic conductive film 101.

The display panel 200 is configured to display an image, and may be, for example, an OLED panel. In an alternative exemplary embodiment, however, the display panel 200 may be one of: an LCD panel, an EPD panel, a light emitting diode ("LED") panel, an inorganic electro luminescent ("EL") display panel, a field emission display ("FED") panel, a surface conduction electron-emitter display ("SED") panel, a plasma display panel ("PDP"), and a cathode ray tube ("CRT"). However, these are merely illustrative examples and any kind of display panels that are currently developed and commercialized or will be realized with future technological advancements may be suitable for the display panel 200 according to the present invention.

The display panel 200 includes a substrate 111, an encapsulation substrate 201 facing the substrate 111, a pixel unit 150, and a sealant 290. However, the sixth exemplary embodiment is not limited thereto, and the substrate 111 may be encapsulated by a thin film encapsulation layer or the like in lieu of the encapsulation substrate 201.

The substrate 111 includes a display area DA for displaying an image by light emission and a non-display area NDA positioned at an outline of the display area DA. A plurality of pixels is formed in the display area DA of the substrate 111 to form the pixel unit 150.

The non-display area NDA includes a pad area PA on which a plurality of pad wirings 270 and 280 are formed to receive an external signal which supplies signals to the OLED 210 to emit light. At least one driving chip 250 may be formed on the pad area PA.

The pixel unit 150 is formed on the substrate 111 and includes the OLED 210 and a wiring unit 130 (FIG. 24) for driving the OLED 210. A wiring unit 130 of the pixel unit 150 is connected to the driving chip 250. The pixel unit 150 will be described further below with reference to FIGS. 23 and 24. Any display element that is applicable to display devices may constitute the pixel unit 150 in lieu of the OLED 210.

The encapsulation substrate 201 is disposed to face the substrate 111, and is attached to the substrate 111 using the sealant 290. The encapsulation substrate 201 covers the pixel unit 150. The encapsulation substrate 201 may be smaller than the substrate 111 in size. Accordingly, the pad area PA of the substrate 111 may be exposed by the encapsulation substrate 201.

A polarizer (not illustrated) may be disposed on the encapsulation substrate 201. The polarizer may prevent reflection of ambient light.

The sealant 290 may be a commonly used material, such as a sealing glass frit.

The printed circuit board 260 is a circuit board that applies a driving signal to the display panel 200. The printed circuit board 260 may include, for example, a timing controller for generating a control signal (that may allow the display panel 200 to be operated) and a power voltage generator for generating a power voltage.

The printed circuit board 260 may be disposed on one surface of the display panel 200. For example, the printed circuit board 260 may be disposed on a rear surface of the display panel 200. In general, the display panel 200 may display images on a top surface of the display panel 200, and thus the rear surface of the display panel 200 may correspond to an area which is not visible to users. Accordingly, in order to significantly improve spatial efficiency and hide elements unnecessary to be seen by users, the printed circuit board 260 may be disposed on the rear surface of the display panel 200. However, the aforementioned description is illustrated as an example, and the printed circuit board 260 may be disposed on a side surface of the display panel 200 and the printed circuit board 260 and the flexible printed circuit board 240 may be integrally formed.

According to the sixth exemplary embodiment, the circuit member may include the flexible printed circuit board 240 and the driving chip 250. The circuit member may be electrically connected to the pad wirings 270 and 280 in the pad area PA through the anisotropic conductive film 101.

The flexible printed circuit board 240 is electrically connected to the display panel 200 and the printed circuit board 260, thus providing electric connection between the display panel 200 and the printed circuit board 260. The flexible printed circuit board 240 is connected to the pad wiring 280 in the pad area PA through the anisotropic conductive film 101.

Although not illustrated, the flexible printed circuit board 240 may include, when viewed in cross-section, a base film and a wiring pattern on the base film, and may further include a cover film on the wiring pattern.

The base film and the cover film may include a film that is formed of a material having high flexibility, insulation, and thermo-resistance properties, for example, polyimide. However, the present invention is not limited thereto.

A wiring pattern may be disposed between the base film and the cover film. The wiring pattern may serve to transmit a set or predetermined electric signal, and may include a metal material such as copper (Cu). The surface of the copper may be plated with, for example, tin, silver, and/or nickel.

The driving chip 250 is electrically connected to pad wiring 270 in the pad area PA through the anisotropic conductive film 101. The driving chip 250 may be an integrated circuit ("IC") chip, such as a driving IC.

Figure 21:
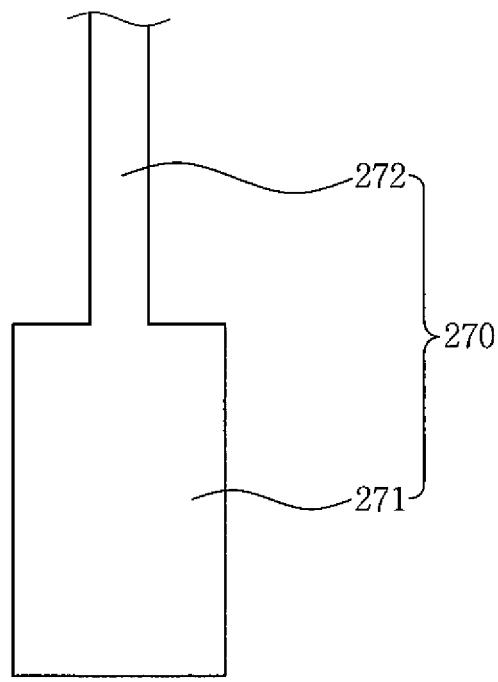
FIG. 21 is a partial plan view illustrating a conductive pad.
Figure 22:
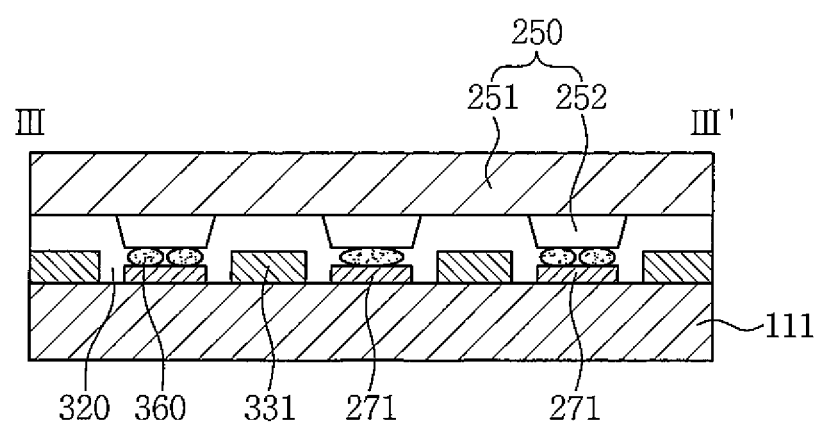
FIG. 22 is a cross-sectional view taken along line III-III' of FIG. 19.

FIG. 21 is a partial plan view illustrating the pad wiring 270; and FIG. 22 is a cross-sectional view taken along line III-III' of FIG. 19.

In reference to FIGS. 21 and 22, the pad wiring 270 includes a thin film wiring 272 extending from the pixel unit 150 and a conductive pad 271 disposed on an end portion of the thin film wiring 272. The thin film wiring 272 is connected to the wiring unit 130 of the pixel unit 150. The conductive pad 271 is sized and positioned to correspond to the driving chip 250, and is connected to the driving chip 250 through the anisotropic conductive film 101.

A material forming the pad wiring 270 is not particularly limited. In one embodiment, the pad wiring 270 may be formed of a material the same as a material forming the source electrode and the drain electrode forming the thin film transistor.

The driving chip 250 includes a driving chip body 251 and a bump 252 extending from the driving chip body 251 to be connected to the conductive pad 271 of the pad wiring 270. The driving chip 250 is connected to the pad wiring 270 to control light emission of the OLED 210. The bump 252 of the driving chip 250 is connected to the conductive pad 271 of the pad wiring 270 by the conductive particles 360 of the anisotropic conductive film 101.

The driving chip body 251 includes a scan driver and a data driver, the scan and data drivers being for driving the pixels. The bump 252 is formed on the driving chip body 251 and overlaps the conductive pad 271 of the pad wiring 270.

The driving chip 250 may be mounted on the pad area PA of the substrate 111 to be electrically connected to the pad wiring 270 in a chip-on-glass (COG) manner.

The driving chip 250 may not be formed in the non-display area NDA and may be omitted. Further, the driving chip 250 may be mounted on the flexible printed circuit board in a chip-on-film (COF) manner. For example, a tape carrier package (TCP) in which the driving chip 250 is mounted on the film in a chip form may be applied to the OLED display device 106.

The anisotropic conductive film 101 connects the driving chip 250 to the conductive pad 271 to allow the driving chip 250 to be mounted on the substrate 111. The anisotropic conductive film 101 is disposed between the conductive pad 271 and the bump 252 to electrically connect the pad wiring 270 and the bump 252.

Hereinafter, the pixel unit 150 and the pixel will be described with reference to FIGS. 23 and 24.

Figure 23:
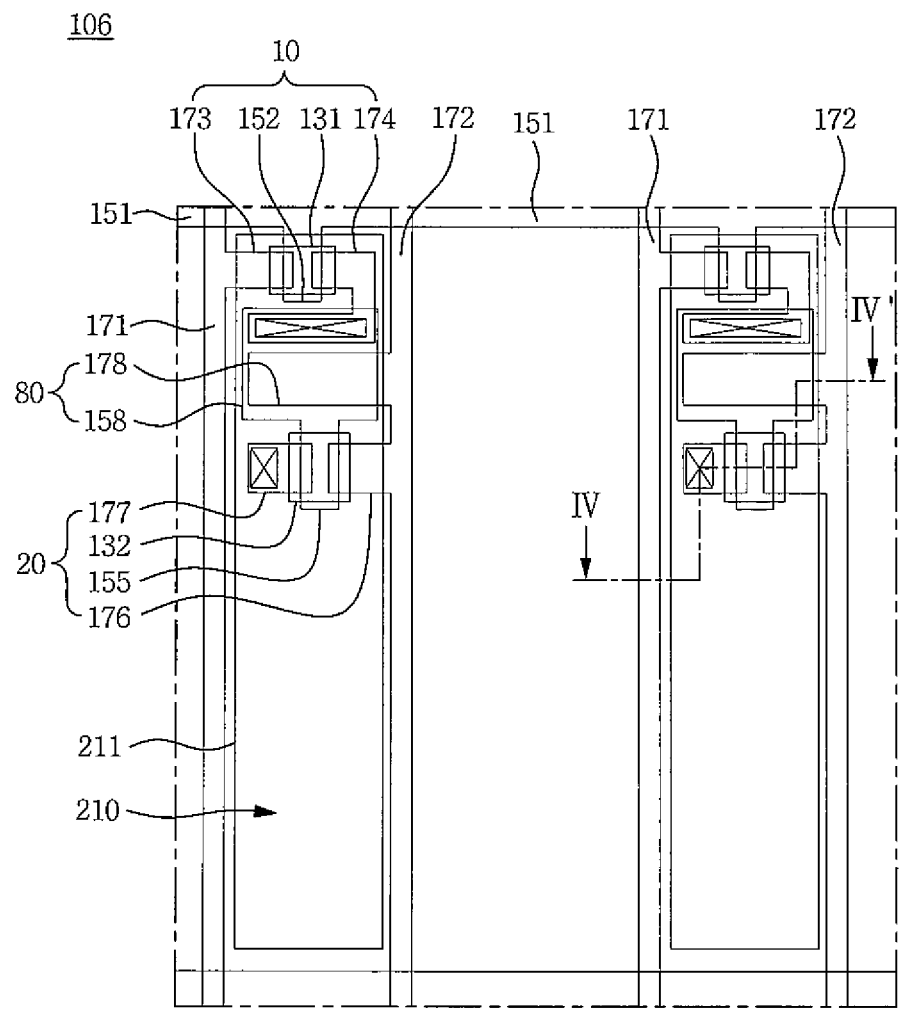
FIG. 23 is an enlarged plan view illustrating portion A of FIG. 19.
Figure 24:
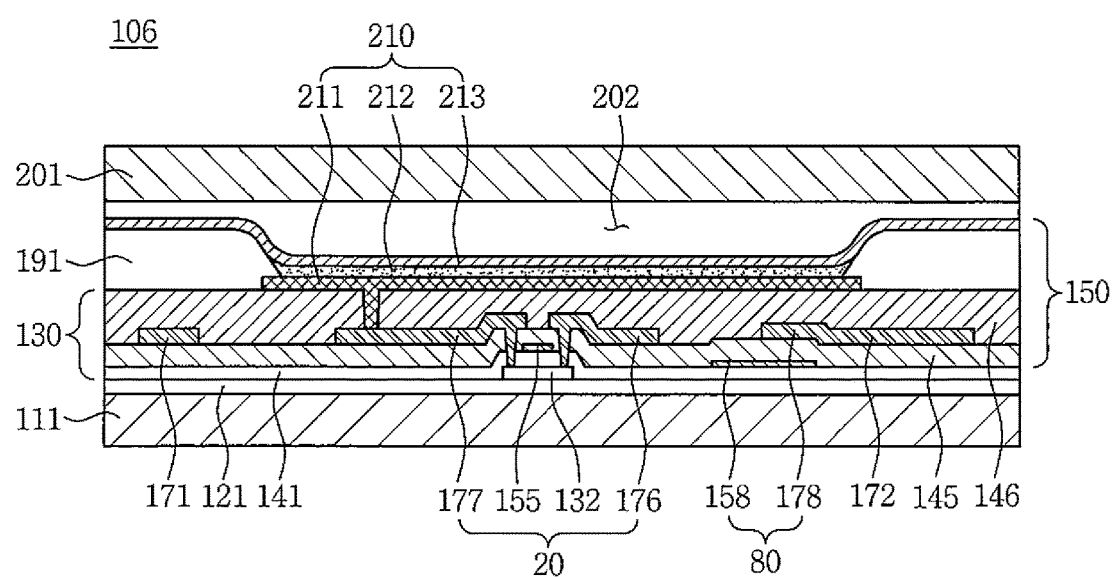
FIG. 24 is a cross-sectional view taken along line IV-IV' of FIG. 23.

FIG. 23 is an enlarged plan view illustrating portion A of FIG. 19; and FIG. 24 is a cross-sectional view taken along line IV-IV' of FIG. 23.

In reference to FIGS. 23 and 24, the display panel 200 includes the substrate 111, the wiring unit 130, the OLED 210, and the encapsulation substrate 201. Herein, the wiring unit 130 and the OLED 210 constitute the pixel unit 150.

The substrate 111 may include an insulating material including one selected from the group consisting of: glass, quartz, ceramic, plastic, the like, and combinations thereof. In an exemplary embodiment, the substrate 111 may include a metal material such as stainless steel.

A buffer layer 121 is formed on the substrate 111. The buffer layer 121 may include at least one layer selected from various inorganic layers and organic layers. The buffer layer 121 may significantly reduce infiltration of undesirable elements, such as moisture, into the wiring unit 130 and/or the OLED 210 and also planarize a surface of the substrate 111. However, in one or more embodiments, the buffer layer 121 may not be necessary and may be omitted.

The wiring unit 130 is disposed on the buffer layer 121. The wiring unit 130 is a component including a switching thin film transistor ("TFT") 10, a driving TFT 20, and a capacitor 80, and is configured to drive the OLED 210. The OLED 210 may display an image by emitting light based on a driving signal applied from the wiring unit 130.

FIGS. 23 and 24 illustrate an active-matrix-type organic light emitting diode ("AMOLED") display having a 2Tr-1Cap structure, which includes two TFTs, for example the switching TFT 10 and the driving TFT 20, and the capacitor 80 in each pixel. However, the display device according to the sixth exemplary embodiment is not limited thereto. For example, the OLED display device 106 may include three or more TFTs and two or more capacitors 80 in each pixel, and may further include additional wirings to have various structures. Herein, the term "pixel" refers to the smallest unit for displaying an image, and the display area displays an image using a plurality of pixels.

Each of the pixels includes the switching TFT 10, the driving TFT 20, the capacitor 80, and the OLED 210. In addition, a gate line 151 disposed along one direction and a data line 171 and a common power line 172 insulated from and intersecting the gate line 151 are disposed on the wiring unit 130. Herein, each pixel may be defined by the gate line 151, the data line 171, and the common power line 172, but is not limited thereto. The pixel may be defined by a pixel defining layer (PDL) or a black matrix.

The OLED 210 may include a first electrode 211, an organic light emitting layer 212 formed on the first electrode 211, and a second electrode 213 formed on the organic light emitting layer 212. Holes and electrons are injected to the organic light emitting layer 212 from the first electrode 211 and the second electrode 213, respectively. The injected holes and electrons are combined with each other to form an exciton, and then light is emitted by energy generated when the exciton falls from an excited state to a ground state.

The capacitor 80 includes a pair of storage electrodes 158 and 178 with an insulating interlayer 145 interposed therebetween. Herein, the insulating interlayer 145 may include a dielectric material. A capacitance of the capacitor 80 is determined by electric charges accumulated in the capacitor 80 and a voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The semiconductor layers 131 and 132 and the gate electrodes 152 and 155 are insulated from a gate insulating layer 141.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and is connected to one of the storage electrodes 158.

The driving TFT 20 may apply a driving power to the first electrode 211, which serves as a pixel electrode, to allow the organic light emitting layer 212 of the OLED 210 in a selected pixel to emit light. The driving gate electrode 155 is connected to the storage electrode 158 that is connected to the switching drain electrode 174. The driving source electrode 176 and the other of the storage electrodes 178 each are connected to the common power line 172. The driving drain electrode 177 is connected to the first electrode 211 of the OLED 210 through a drain contact hole 181.

With the above-described structure, the switching TFT 10 may be operated by a gate voltage applied to the gate line 151 and may function to transmit to the driving TFT 20 a data voltage applied to the data line 171. A voltage equivalent to a difference between a common voltage applied from the common power line 172 to the driving TFT 20 and the data voltage transmitted from the switching TFT 10 may be stored in the capacitor 80, and a current corresponding to the voltage stored in the capacitor 80 may flow to the OLED 210 through the driving TFT 20, so that the OLED 210 may emit light.

Herein, the first electrode 211 is an anode serving as a hole injection electrode, and the second electrode 213 is a cathode serving as an electron injection electrode. However, the sixth exemplary embodiment is not limited thereto. For example, the first electrode 211 may be a cathode and the second electrode 213 may be an anode.

A planarization layer 146 is disposed on the insulating interlayer 145. The planarization layer 146 may be formed of an insulating layer to protect the wiring unit 130. The planarization layer 146 and the insulating interlayer 145 may be formed of the same material.

The drain electrode 177 of the driving TFT 20 is connected to the first electrode 211 of the OLED 210 through a contact hole defined in the planarization layer 146.

According to the sixth exemplary embodiment, the first electrode 211 is a reflective electrode and the second electrode 213 is a transflective electrode. Accordingly, light emitted from the organic light emitting layer 212 may be transmitted through the second electrode 213 to be emitted.

The reflective electrode and the transflective electrode may be made out of one or more metals selected from: magnesium (Mg), silver (Ag), gold (Au), calcium (Ca), lithium (Li), chromium (Cr), aluminum (Al), copper (Cu), and alloys thereof. Whether the electrode is a reflective type or a transflective type may be determined based on a thickness of the electrode. In general, the transflective layer has a thickness of 200 nm or less. As the thickness of the transflective layer decreases, a level of light transmittance may increase, and as the thickness thereof increases, the light transmittance may decrease.

In one or more embodiments, the first electrode 211 may include a reflective layer including at least one metal selected from magnesium (Mg), silver (Ag), gold (Au), calcium (Ca), lithium (Li), chromium (Cr), aluminum (Al), and copper (Cu), and a transparent conductive layer disposed on the reflective layer. The transparent conductive layer may include a transparent conductive oxide (TCO), for example, at least one of indium tin oxide (ITO), indium zinc oxide (IZO), zinc oxide (ZnO), aluminum zinc oxide (AZO), and indium oxide ($In_2O_3$). Since such a transparent conductive layer has a relatively high work function, hole injection through the first electrode 211 may be readily performed.

In addition, the first electrode 211 may have a triple-layer structure in which a transparent conductive layer, a reflective layer, and a transparent conductive layer are sequentially stacked.

The second electrode 213 may include a transflective layer including at least one metal of magnesium (Mg), silver (Ag), gold (Au), calcium (Ca), lithium (Li), chromium (Cr), aluminum (Al), and copper (Cu).

Although not illustrated, at least one of a hole injection layer (HIL) and a hole transporting layer (HTL) may further be disposed between the first electrode 211 and the organic light emitting layer 212. In addition, at least one of an electron transporting layer (ETL) and an electron injection layer (EIL) may further be disposed between the organic light emitting layer 212 and the second electrode 213.

The organic light emitting layer 212, the HIL, the HTL, the ETL, and the EIL may be collectively referred to as an organic layer. Such an organic layer may be formed of a low molecular weight organic material or a polymer organic material.

The pixel defining layer 191 has an opening. The opening of the pixel defining layer 191 exposes a portion of the first electrode 211. The first electrode 211, the organic light emitting layer 212, and the second electrode 213 are sequentially stacked in the opening of the pixel defining layer 191. The second electrode 213 may be disposed on the organic light emitting layer 212 and on the pixel defining layer 191. The OLED 210 emits light from the organic light emitting layer 212 disposed in the opening of the pixel defining layer 191. Accordingly, the pixel defining layer 191 may define a light emission area.

In order to protect the OLED 210, the encapsulation substrate 201 is disposed on the OLED 210 and faces the substrate 111. The encapsulation substrate 201 may be formed of the same material as the substrate 111.

Additionally, a buffer member 202 is disposed between the second electrode 213 and the encapsulation substrate 201. The buffer member 202 may protect interior components, such as the OLED 210 from impact that may be applied from the outside of the OLED display device 106. The buffer member 202 may enhance device reliability of the OLED display device 106. The buffer member 202 may include at least one of an organic sealant, such as a urethane-based resin, an epoxy-based resin, and an acrylic resin; and an inorganic sealant, such as silicon. The urethane-based resin may include, for example, urethane acrylate. The acrylic resin may include, for example, butyl acrylate and ethylhexylacrylate.

As set forth hereinabove, the anisotropic conductive film having a fine, uniform pattern may be readily manufactured through the laser interference lithography method using the interference laser beam. The anisotropic conductive film according to an exemplary embodiment manufactured in such a manner may electrically connect the circuit member to the conductive pad of the substrate with high reliability.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the scope and spirit of the present teachings. Various features of the above described and other embodiments can be combined in any manner to produce further embodiments consistent with the invention.

What is claimed is:

1. An anisotropic conductive film, comprising:
   a base film;
   at least one support unit directly on a surface of the base film, the support unit defining at least one opening, the at least one opening extending completely through the support unit to the base film;
   a plurality of conductive particles disposed in the at least one opening; and
   an adhesive layer on the support unit and the plurality of conductive particles,
   wherein the at least one opening comprises a plurality of openings in a first direction parallel to the surface of the base film,
   a plurality of portions of the at least one support unit and the plurality of openings are alternately disposed in the first direction, and
   at least one of the plurality of conductive particles is disposed in each of the plurality of openings, and
   the adhesive layer is nonconductive.

2. The anisotropic conductive film of claim 1, wherein the support unit comprises a plurality of parallel linear patterns defining the plurality of openings, each linear pattern having a width of about 200 nm to about 600 nm, and wherein adjacent linear patterns are spaced apart by an interval of about 200 nm to about 600 nm.

3. The anisotropic conductive film of claim 1, wherein the support unit comprises a mesh pattern defining the plurality of openings spaced apart from each other.

4. The anisotropic conductive film of claim 3, wherein each opening of the plurality of openings has a cross-sectional shape selected from the group consisting of a circular shape, an elliptical shape, and a polygonal shape.

5. The anisotropic conductive film of claim 3, wherein each opening of the plurality of openings has a diameter of about 200 nm to about 600 nm.

6. The anisotropic conductive film of claim 1, wherein the support unit comprises a plurality of pillars.

7. The anisotropic conductive film of claim 1, wherein each of the plurality of conductive particles has a particle size of about 20 nm to about 600 nm.

8. An anisotropic conductive film comprising:
a base film;
a support-unit pattern directly on a surface of the base film, the support-unit pattern defining at least one opening;
a plurality of conductive particles dispersed in the support-unit pattern and not disposed in the at least one opening; and
an adhesive layer on the support-unit pattern and in the at least one opening,
wherein the support-unit pattern comprises a linear stripe-shaped pattern, a mesh pattern, or a pillar pattern,
the at least one opening comprises a plurality of openings in a first direction parallel to the surface of the base film,
a plurality of portions of the support-unit pattern and the plurality of openings are alternately disposed in the first direction,
at least one of the plurality of conductive particles is disposed in each of the plurality of portions of the support-unit pattern, and
the adhesive layer is nonconductive.

9. The anisotropic conductive film of claim 8, wherein at least a portion of the conductive particles are exposed on an upper surface of the support-unit pattern.

10. A display device comprising:
a substrate comprising a pad area;
a conductive pad on the pad area;
an anisotropic conductive film on the conductive pad; and
a circuit member on the anisotropic conductive film, the circuit member electrically connected to the conductive pad through the anisotropic conductive film,
wherein the anisotropic conductive film comprises:
a support unit directly on the substrate, the support unit defining at least one opening extending completely through the support unit to the conductive pad;
a plurality of conductive particles disposed in the at least one opening; and
an adhesive layer on the support unit and the plurality of conductive particles,
wherein at least a part of the support unit is disposed between the plurality of conductive particles, and
wherein the adhesive layer is nonconductive.

11. The display device of claim 10, wherein the support unit comprises a linear stripe-shaped pattern, a mesh pattern, or a pillar pattern.

12. The display device of claim 10, wherein the circuit member is one of a driving chip and a flexible printed circuit board (FPCB).

13. The anisotropic conductive film of claim 1, wherein the plurality of conductive particles are directly in contact with the base film.

14. An anisotropic conductive film comprising:
a base film;
a support-unit pattern directly on a surface of the base film, the support-unit pattern defining at least one opening;
a plurality of conductive particles dispersed in the support-unit pattern and not disposed in the at least one opening; and
an adhesive layer on the support-unit pattern,
wherein the support-unit pattern comprises a linear stripe-shaped pattern, a mesh pattern, or a pillar pattern,
the at least one opening comprises a plurality of openings in a first direction parallel to the surface of the base film,
a plurality of portions of the support-unit pattern and the plurality of openings are alternately disposed in the first direction,
at least one of the plurality of conductive particles is disposed in each of the plurality of portions of the support-unit pattern, and
the adhesive layer includes an adhesive polymer resin.

15. The anisotropic conductive film of claim 14, wherein at least a portion of the conductive particles are exposed on an upper surface of the support-unit pattern.

16. A display device comprising:
a substrate comprising a pad area;
a conductive pad on the pad area;
an anisotropic conductive film on the conductive pad; and
a circuit member on the anisotropic conductive film, the circuit member electrically connected to the conductive pad through the anisotropic conductive film,
wherein the anisotropic conductive film comprises:
a support unit directly on the substrate, the support unit defining at least one opening extending completely through the support unit to the conductive pad;
a plurality of conductive particles disposed in the at least one opening; and
an adhesive layer on the support unit and the plurality of conductive particles,
wherein at least a part of the support unit is disposed between the plurality of conductive particles, and
the adhesive layer includes an adhesive polymer resin.

17. The display device of claim 16, wherein the support unit comprises a linear stripe-shaped pattern, a mesh pattern, or a pillar pattern.

18. The display device of claim 16, wherein the circuit member is one of a driving chip and a flexible printed circuit board (FPCB).

* * * * *